US007332800B2

(12) United States Patent
Kikuchi et al.

(10) Patent No.: US 7,332,800 B2
(45) Date of Patent: Feb. 19, 2008

(54) SEMICONDUCTOR DEVICE

(75) Inventors: Takashi Kikuchi, Inagi (JP); Ryosuke Kimoto, Hamura (JP); Hiroshi Kawakubo, Fussa (JP); Takashi Miwa, Fussa (JP); Chikako Imura, Higashiyamato (JP); Takafumi Nishita, Iruma (JP); Hiroshi Koyama, Tachikawa (JP); Masanori Shibamoto, Saitama (JP); Masaru Kawakami, Machida (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/860,073

(22) Filed: Jun. 4, 2004

(65) Prior Publication Data

US 2005/0040509 A1     Feb. 24, 2005

(30) Foreign Application Priority Data

| Jun. 4, 2003 | (JP) | ............................. 2003-159305 |
| Jun. 20, 2003 | (JP) | ............................. 2003-175792 |
| Jul. 18, 2003 | (JP) | ............................. 2003-199467 |

(51) Int. Cl.
   *H01L 23/02*     (2006.01)
(52) U.S. Cl. .............................. 257/686; 257/E25.027
(58) Field of Classification Search ................. 257/686
   See application file for complete search history.

(56) References Cited

U.S. PATENT DOCUMENTS

| 6,335,585 | B1 |   | 1/2002 | Nagata |   |
| 6,607,937 | B1 | * | 8/2003 | Corisis | ......................... 438/108 |
| 7,045,887 | B2 | * | 5/2006 | Karnezos | .................... 257/686 |
| 2001/0028104 | A1 | * | 10/2001 | Fukatsu et al. | ............. 257/685 |
| 2002/0038907 | A1 | * | 4/2002 | Miyamoto et al. | .......... 257/686 |
| 2003/0030143 | A1 | * | 2/2003 | Wennemuth et al. | ....... 257/738 |
| 2003/0042591 | A1 | * | 3/2003 | Goller et al. | ............... 257/686 |
| 2003/0080441 | A1 | * | 5/2003 | Bolken | ........................ 257/787 |
| 2003/0197260 | A1 | * | 10/2003 | Nishimura et al. | ......... 257/686 |
| 2004/0222508 | A1 | * | 11/2004 | Aoyagi | ....................... 257/686 |

FOREIGN PATENT DOCUMENTS

JP          07-106509          4/1995

OTHER PUBLICATIONS

Chinese Office Action, dated Jul. 20, 2007, Issued In Application No. 200410038338.2.

* cited by examiner

*Primary Examiner*—Evan Pert
*Assistant Examiner*—Ben P Sandvik
(74) *Attorney, Agent, or Firm*—Antonelli, Terry, Stout & Kraus, LLP.

(57) ABSTRACT

For high density packaging of a semiconductor device, the semiconductor device has a multi-layer substrate, a first-stage chip connected electrically to the multi-layer substrate, other package substrates stacked in three stages on the multi-layer substrate and each connected to an underlying wiring substrate through solder balls, second-, third- and fourth-stage chips electrically connected respectively to the other package substrates, and solder balls provided on the bottom multi-layer substrate. The number of wiring layers in the bottom multi-layer substrate which has a logic chip is larger than that in the package substrates which have memory chips, whereby the semiconductor device can have a wiring layer not used for distribution of wires to the solder balls and wiring lines in the wiring layer can be used for the mounting of another semiconductor element or a passive component to attain high density packaging of the semiconductor device as a stacked type package.

13 Claims, 42 Drawing Sheets

FIG. 27
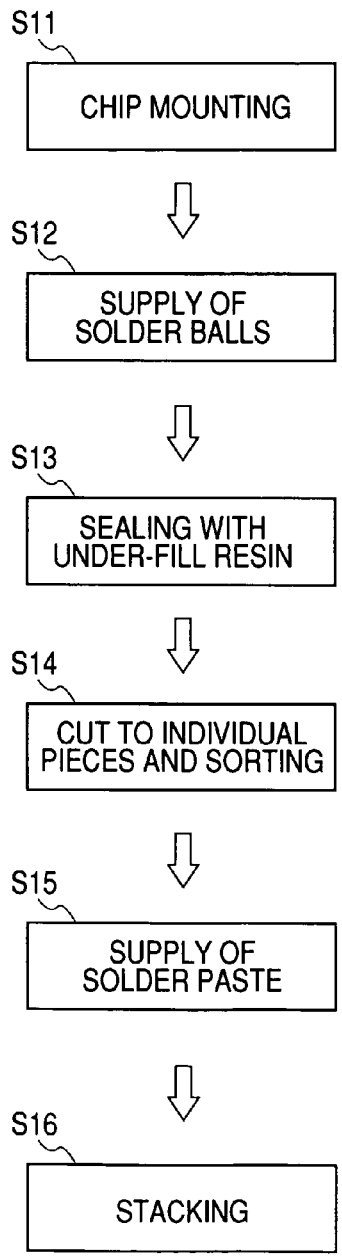
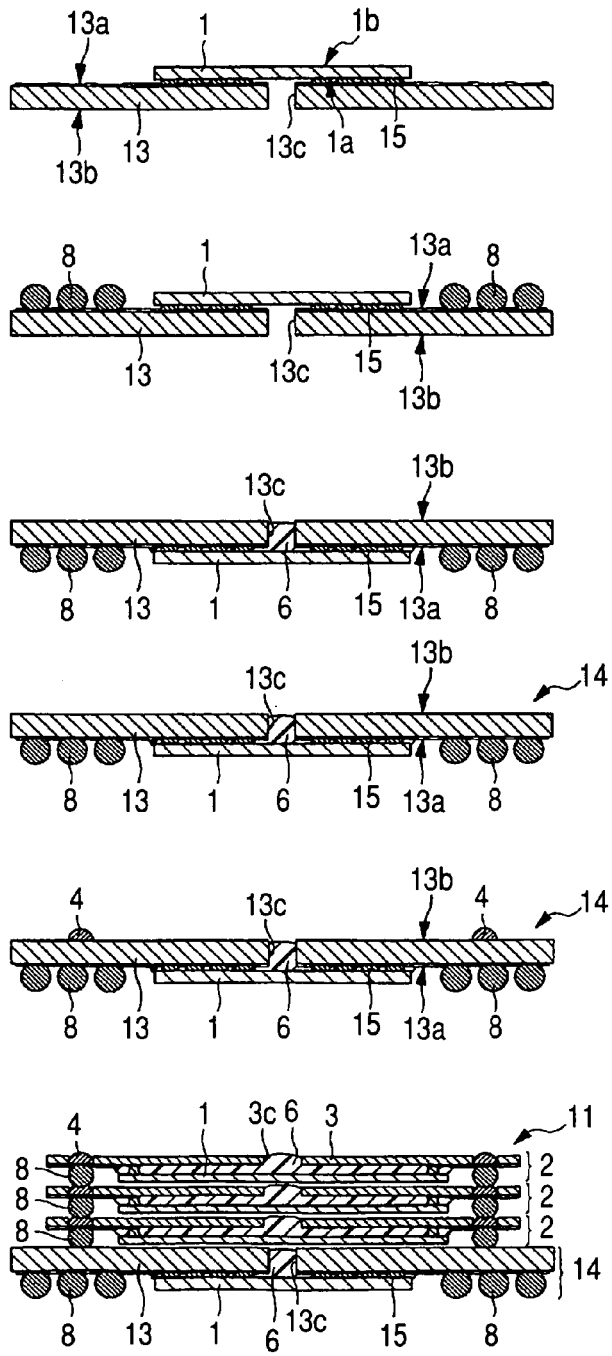

SEMICONDUCTOR DEVICE

CROSS-REFERENCE TO RELATED APPLICATION

The present application claims priority from Japanese patent applications JP 2003-199467, filed on Jul. 18, 2003, JP 2003-159305, filed on Jun. 4, 2003 and JP 2003-175792, filed on Jun. 20, 2003, the content of each of which is hereby incorporated by reference into this application.

BACKGROUND OF THE INVENTION

The present invention relates to a semiconductor device. More particularly, the present invention is concerned with a technique that is applicable effectively to a semiconductor device having a stacked structure formed of plural wiring substrates.

In conventional stacked type semiconductor devices, two or more semiconductor devices, each having a semiconductor element mounted in a recess formed in an insulating substrate, are stacked on an external substrate; and, the semiconductor devices themselves are made thin, so that various types of semiconductor elements can be mounted in three dimensions (see, for example, Patent Literature 1).

[Patent Literature 1]

Japanese Unexamined Patent Publication No. Hei 7 (1995)-106509 (FIG. 1).

SUMMARY OF THE INVENTION

As a result of studies directed to stacked type and small-sized, high-function semiconductor devices, the following problems were discovered.

Demands for semiconductor devices mounted in portable small-sized electronic devices and the like have been mainly directed to a reduction of the size and thickness thereof and the attainment of higher functions therein. In this connection, for the attainment of higher functions in a small-sized BGA (Ball Grid Array), if the number of semiconductor chips is increased, there arises the problem that a reduction of the cost is difficult due to the influence of yield in sorting chips.

In a system in a package formed as a combination of logic/ASIC and memory, there arises the problem that the distribution of wires in wire bonding is difficult due to the positional relation between common pins and independent pins. Further, in wire bonding in a small-size and thin package, it is difficult to keep the package height at a certain level due to the influence of loop height.

It is an object of the present invention to provide a semiconductor device that is capable of attaining a high-density in packaging.

It is another object of the present invention to provide a semiconductor device that is capable of enhanced the reliability.

It is a further object of the present invention to provide a semiconductor device that is capable of attaining higher functions.

The above and other objects and novel features of the present invention will become apparent from the following description and the accompanying drawings.

The following is a brief description of typical examples of the invention as disclosed herein.

According to the present invention, a semiconductor device is provided which includes a wiring substrate having a first main surface and a second main surface, a semiconductor chip bonded and electrically connected to the wiring substrate, other wiring substrate(s) stacked in one or plural stages on the first main surface of the wiring substrate and each connected electrically to an underlying wiring substrate through plural salient electrodes, other semiconductor chip(s) mounted on and electrically connected to the other wiring substrate(s) stacked in one or plural stages, and plural external terminals formed on the second main surface of the wiring substrate, wherein the number of wiring layers in the wiring substrate is larger than that of the wiring layers in the other wiring substrate(s).

BRIEF DESCRIPTION OF THE DRAWINGS

FIG. 27 is a manufacturing process flow chart showing an example of a procedure for assembling the semiconductor device illustrated in FIG. 26;

DETAILED DESCRIPTION OF PREFERRED EMBODIMENTS

Figure 1:
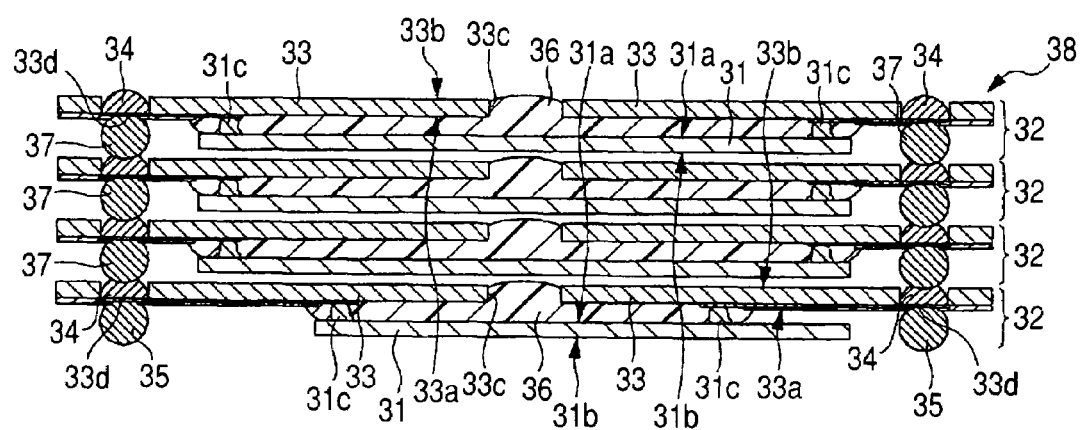
FIG. 1 is a sectional view showing a structural example of a semiconductor device according to a first embodiment of the present invention.

In the following description of the embodiments, as to the same or similar portions, repeated explanations thereof will be omitted in principle except where required.

Where required for convenience' sake, the embodiments may be described in a divided manner as plural sections or embodiments, but unless otherwise mentioned, they are not unrelated to each other, but are in a relation such that one represents a modification, a description of details, or a supplementary explanation, of part or the whole of the other.

In the following description of the embodiments, when reference is made to a number of elements (including the number, numerical value, quantity, and range), no limitation is made to the number referred to, but numerals above and below the number referred to will do as well, unless otherwise mentioned and except in the case where it is basically evident that a limitation is made to the number referred to.

Embodiments of the present invention will be described in detail hereinunder with reference to the accompanying drawings. In all of the drawings, members having the same functions are identified by the same reference numerals, and repeated explanations thereof will be omitted.

First Embodiment

Figure 2:
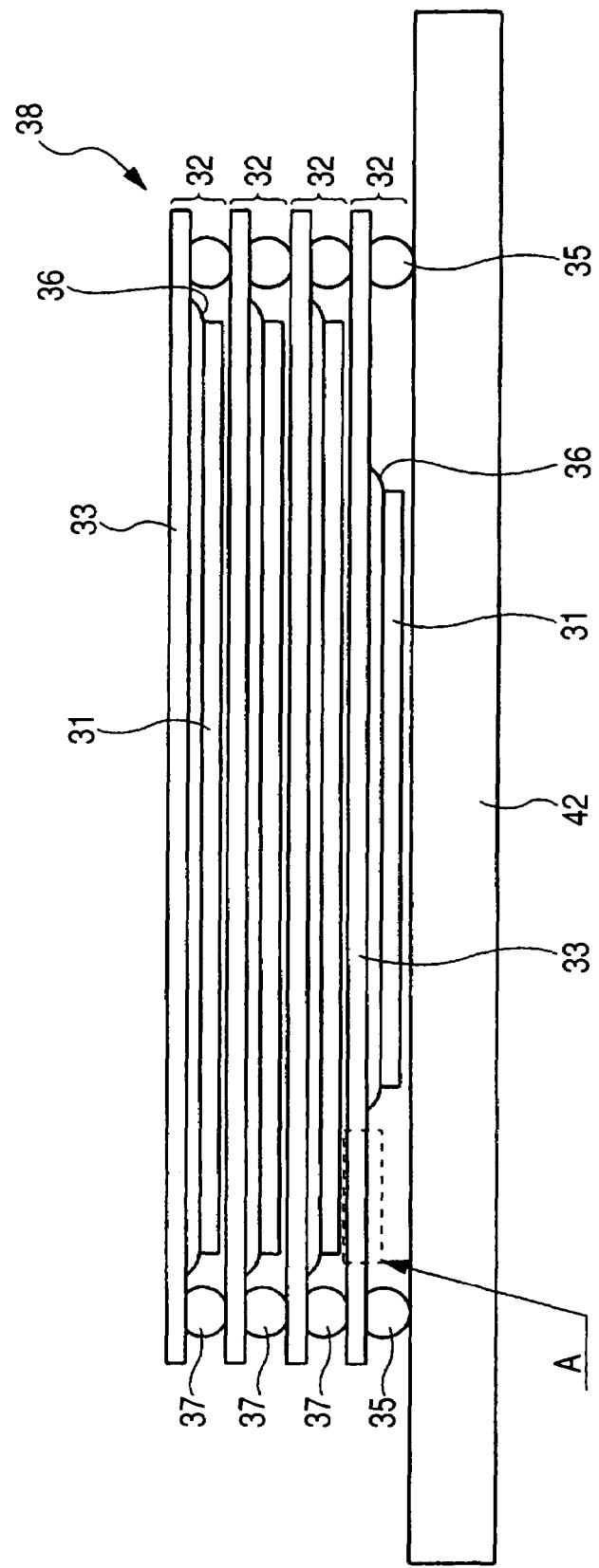
FIG. 2 is a side view showing a mounting structure for mounting the semiconductor device illustrated in FIG. 1 onto a mounting substrate.
Figure 3:
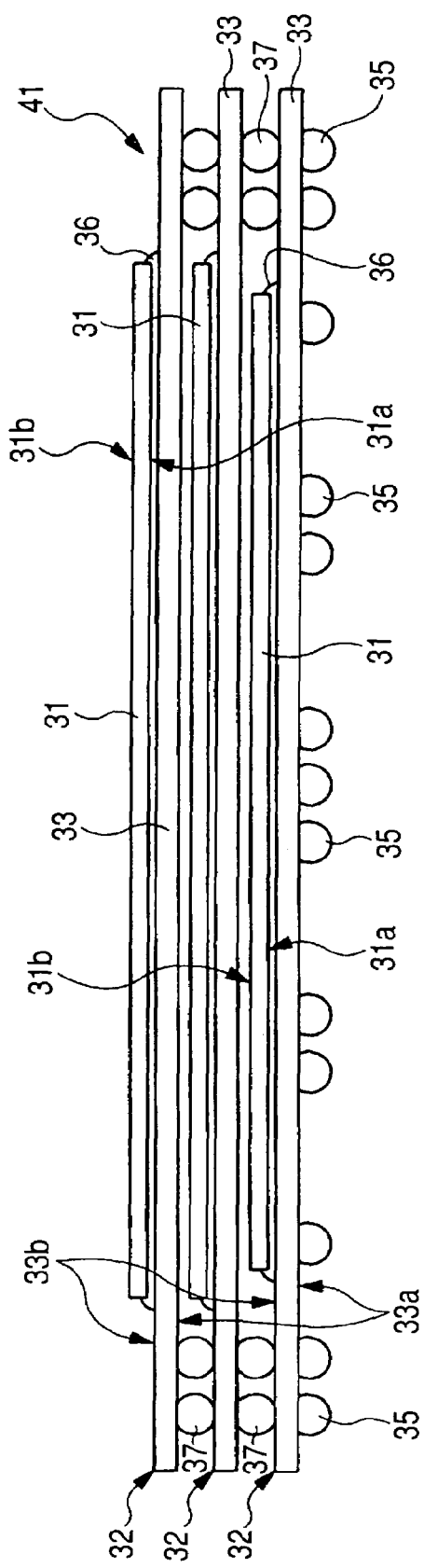
FIG. 3 is a side view showing the structure of a semiconductor device according to a modification of the first embodiment.
Figure 4:
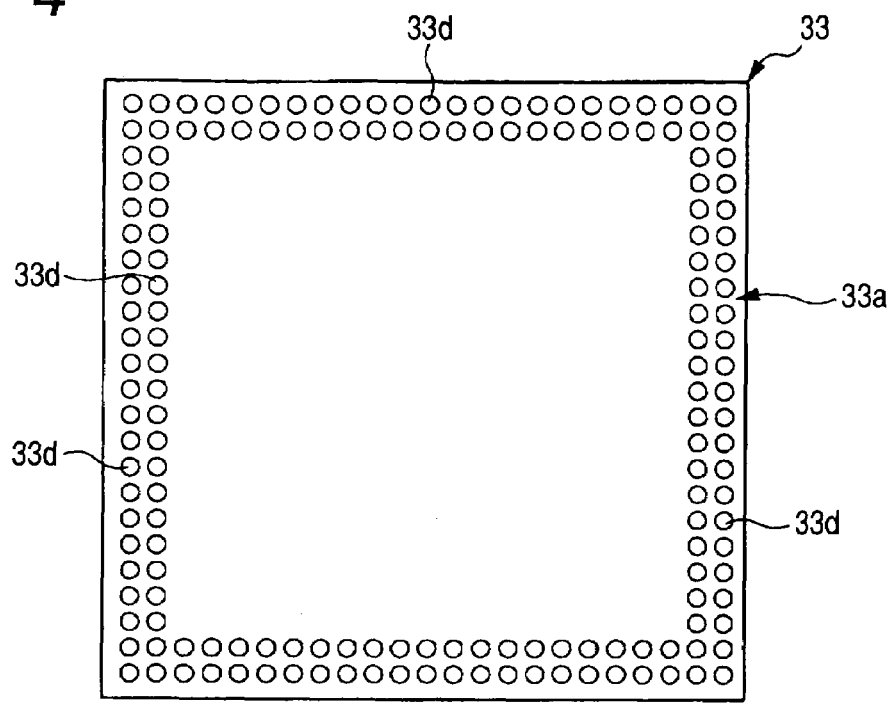
FIG. 4 is a bottom view showing an example of a land array on a memory chip mounting wiring substrate used in the semiconductor device illustrated in FIG. 3.
Figure 5:
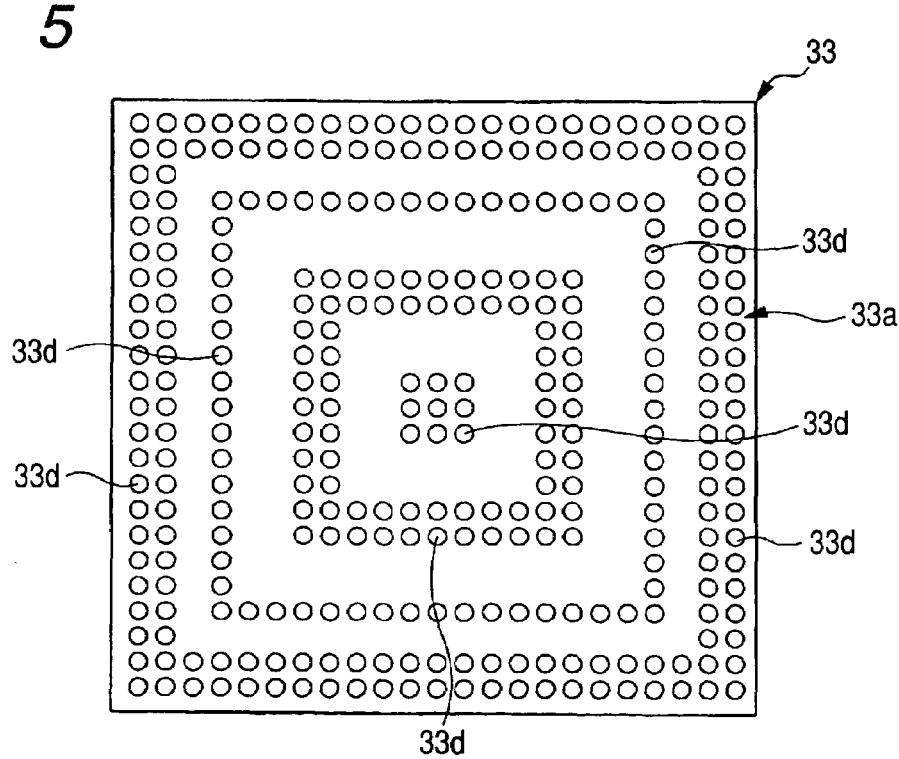
FIG. 5 is a bottom view showing an example of a land array on a logic chip mounting wiring substrate used in the semiconductor device illustrated in FIG. 3.

FIG. 1 is a sectional view showing a structural example of a semiconductor device according to a first embodiment of the present invention; FIG. 2 is a side view showing an example of a mounting structure for mounting the semiconductor device illustrated in FIG. 1 onto a mounting substrate; FIG. 3 is a side view showing the structure of a semiconductor device according to a modification of the first embodiment; FIG. 4 is a bottom view showing an example of a land array on a memory chip mounting wiring substrate in the semiconductor device illustrated in FIG. 3; and FIG. 5 is a bottom view showing an example of a land array on a logic chip mounting wiring substrate in the semiconductor device illustrated in FIG. 3.

The semiconductor device of this first embodiment is in the form of a stacked type package 38 wherein a semiconductor chip 31 is flip-chip-connected to a wiring substrate and plural such structures are stacked.

More specifically, the semiconductor device of this first embodiment is a module product wherein, on a first package structure 32 comprising the semiconductor chip 31 flip-chip-connected to the wiring substrate, there are one or plural other first package structures 32 having the same structure in appearance.

The stacked package 38 shown in FIG. 1 comprises a thin package substrate (wiring substrate) 33 having a back surface 33b as a first main surface and a surface 33a as a second main surface, a semiconductor chip 31 bonded and electrically connected to the package substrate 33, other package substrates (other wiring substrate) stacked in plural stages on the back surface 33b of the package substrate 33 and each connected electrically to the underlying wiring substrate through plural solder balls (salient electrodes) 37, other semiconductor chips 31 mounted and electrically connected respectively to the other package substrates 33 which are stacked in plural stages, and plural solder balls 35 serving as external terminals formed on the surface (second main surface) 33a of the package substrate 33 in the bottom layer. The semiconductor chip 31 mounted on the bottom package substrate 33 is smaller than the other semiconductor chips 31 mounted on the second and higher stages.

Thus, the stacked type package 38 comprises a total of four layers of package structures which are constituted by the first package structure 32 disposed in the bottom layer and the other three first package structures 32 of the same structure stacked in three stages on the bottom first package structure. In this case, the semiconductor chip 31 mounted on the bottom package substrate 33 is smaller than the other semiconductor chips 31 that are mounted on the second-and higher-stage package substrates 33.

Each first package structure 32 comprises a package substrate 33, a semiconductor chip 31 flip-chip-connected to a surface (second main surface, lower surface) 33a of the package substrate 33, plural gold bumps 31c serving as salient electrodes for connection between the semiconductor chip 31 and the package substrate 33, a sealing portion 36 which not only protects flip-chip connections using the gold bumps 31c but also lessens a difference in thermal expansion quantity between chip and substrate, and plural solder balls 35 serving external terminals formed outside and around the semiconductor chip 31 on the package substrate 33.

The surface 33a of the package substrate 33 and the main surface 31a of the semiconductor chip 31 are disposed in opposition to each other and are electrically connected with each other through gold bumps 31c. Further, this flip-chip connection is sealed with resin by an under-fill sealing method, and plural solder balls 35 as external terminals are arranged outside and around the semiconductor chip 31, thus constituting a fan-out type stacked package.

For example, the package structure 33 has a thin, two-layer wiring structure in which plural lands 33d serving as electrodes for mounting the solder balls 35 and 37 are arranged side by side on an outer periphery of the substrate. When attached to the lands 33d, the solder balls 35 and 37 are arranged side by side in a quadrangular shape so as to surround the outside of the semiconductor chip 31.

A through hole 33c which opens to both surface 33a and back surface (first main surface) 33b is formed nearly centrally of the surface second main surface) 33a of the package substrate 33. In assembling the stacked type package 38 and at the time of sealing the flip-chip connection by an under-fill sealing method, resin is injected through the through hole 33c.

In each package structure 32 in the stacked type package 38 of this first embodiment, solder balls 35 and 37 are provided on the surface 33a side which is the same side as the chip mounting side of the package substrate 33.

Thus, in the stacked type package 38, since the individual first package structures 32 are stacked, each first package structure 32 is formed so that the semiconductor chip 32 is lower than the balls 35 and 37 with respect to the package substrate 33.

More specifically, in each first package structure 32, the height of a back surface 31b of the semiconductor chip 31 from the package substrate 33 is lower than the height from the package substrate 33 to the top of each of the solder balls 35 and 37, whereby stacking can be done positively without contact of the back surface 31b of the semiconductor chip 31 with the package substrate 33 in the overlying or underlying first package structure 32.

Further, since the solder balls 35 and 37 are provided on the same surface as the semiconductor chip 31-mounted surface of the package substrate 33, it is possible to attain a reduction in the thickness of the stacked structure.

That is, in the case where the semiconductor chip 31 is flip-chip-connected to the surface 33a of the package substrate 33, the solder balls 35 and 37 are mounted on the same surface 33a; whereby, when another first package structure 32 is stacked on the first package structure 32, the semiconductor chip 31 is disposed on the lower side of the package substrate 33 in the first package structure 32 of the top layer, so that the semiconductor chip 31 does not project from the package substrate 33, thus making it possible to reduce the thickness of the stacked type package 38.

The gap between the flip-chip-connected semiconductor chip 31 and package substrate 33 is 30 to 50 μm, for example, which is very narrow. The gold bumps 31c which serve as salient electrodes for flip-chip connection are, for example, stud bumps formed by the application of a wire bonding technique. However, bump electrodes formed by plating or solder also will do.

The plural solder balls 35 and 37 attached to each first package structure 32 include pins as external terminals of the stacked type package 38 and pins for connection with the underlying other first package structure 32.

In each first package structure 32, an electric connection with the overlying other first package structure 32 is effected by solder paste 34 connected to the lands 33d.

In the stacked type package 38, the semiconductor chip 31 mounted on the package substrate 33 of the bottom layer is smaller than the other semiconductor chips 31 mounted on the overlying other package substrates 33.

That is, of the first package structures 32 stacked in plural stages (four stages in FIG. 1), the semiconductor chip 31 mounted on the lowest-stage first package structure 32 is the smallest in size as compared with the other overlying semiconductor chips 31.

Since the semiconductor chip 31 mounted on the lowest-stage first package structure 32 is thus made relatively small in size, it is possible to form a space between the solder balls 35 which serve as external terminals and the outer periphery of the semiconductor chip 31.

That is, as indicated at portion A in FIG. 2, it is possible to increase the distance between each solder ball 35 which serves as an external terminal and the semiconductor chip 31 and form a space therebetween. As a result, even if a bending stress is imposed on the stacked type package 38 due to heat applied in a reliability test after mounting the stacked type package 38 onto the mounting substrate 42, the bending stress can be absorbed and mitigated in the substrate space portion between the solder balls 35 and the semiconductor chip 31.

As a result, it is possible to enhance the mounting reliability of the stacked type package 38.

Next, a description will be given below concerning a modification of the first embodiment.

A stacked type package (semiconductor device) 41 according to a modification shown in FIG. 3, like the stacked type package 38 shown in FIG. 1, has a stacked structure of plural (three) first package structures 32, but is different from the stacked type package 38 of FIG. 1 in that, in each first package structure 32, the semiconductor chip 31 is mounted on the side opposite to the external terminal-mounted side of the package substrate 33.

That is, in each first package structure 32, the semiconductor chip 31 is mounted on the back surface 33b (upper surface), which serves as the first main surface of the package substrate 33, while the plural solder balls 35 which serve as external terminals are provided on the surface 33a (lower surface), which serves as the second main surface located on the side opposite to the back surface.

According to this arrangement, in the package substrate 33 of the lowest layer, the semiconductor chip 31 is not mounted on the surface 33a which serves as the lower surface, so that, on the surface 33a, the plural solder balls 35 which serve as external terminals, can be disposed in both areas corresponding to the inside and the outside, respectively, of the semiconductor chip 31.

Thus, the stacked package 38 can be formed as a fan-in/-out type, and, hence it is possible to attain a multi-pin structure. FIG. 4 shows a land array on the surface 33a (lower surface) of each of the second- and third-stage package substrates 33, in which lands 33d for mounting the solder balls 37 are arranged on only peripheral edge portions which serve as an outside area of the chip.

On the other hand, FIG. 5 shows a land array on the surface 33a (lower surface) of the package substrate 33 of the lowest layer, in which plural lands 33d for mounting the solder balls 35 are arranged in both inside and outside areas of the chip.

The semiconductor chip 31 mounted on the first package structure 32 of the lowest layer is smaller in size than the semiconductor chips 31 mounted on the overlying other first package structures 32.

According to such a structure, in the case where the stacked package 41 has a memory chip and a logic chip, the memory chip is generally larger in size and has a smaller number of pins than the logic chip. Therefore, by mounting a semiconductor chip 31 having a logic circuit onto the package substrate 33 of the first package structure 32 of the lowest layer, it is possible to ensure a required number of pins of external terminals (solder balls 35) without increasing the package size.

Accordingly, it is possible to attain a high function of the stacked type package 41.

In the package substrate 33 shown in FIG. 3, since solder balls 35 are disposed also below the semiconductor chip 31 mounted on the package substrate 33 of the lowest layer, it is difficult to mitigate an internal stress generated by heat that is applied, for example, in a reliability test after packaging. In such a case, it is preferable to adopt a structure wherein, as shown in FIG. 3, memory chips larger in size are mounted on the package substrates 33 which constitute upper-layer package structures 32 and a gap is formed between the lowest-layer package substrate 33 and the lowest-layer semiconductor chip 31. According to this structure, it is possible to mitigate a large thermal stress generated from the memory chips of the larger chip size, and, hence, it is possible to improve the durability against an internal stress induced by heat applied after packaging.

Second Embodiment

Figure 6:
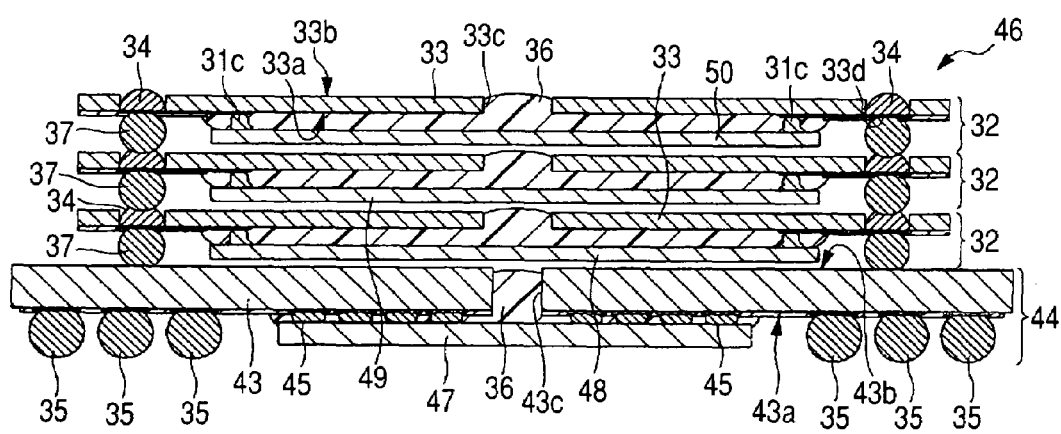
FIG. 6 is a sectional view showing a structural example of a semiconductor device according to a second embodiment of the present invention.
Figure 7:
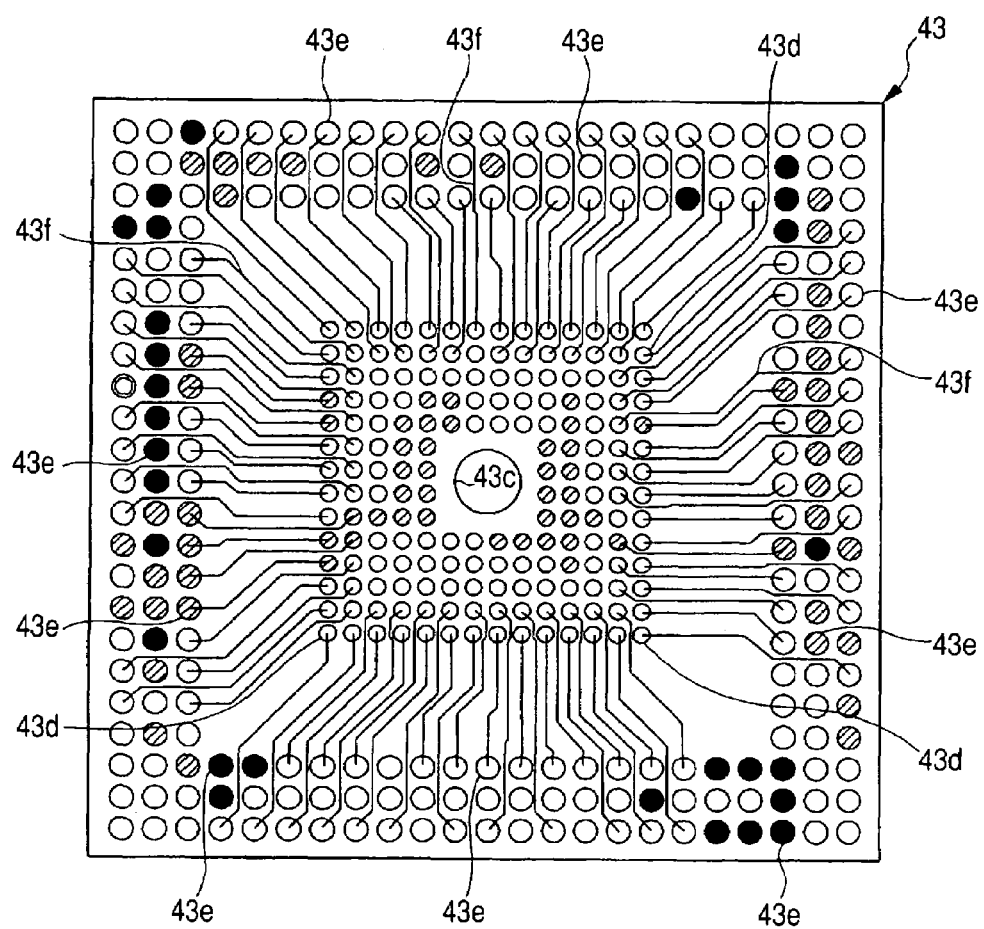
FIG. 7 is a plan view showing an example of the distribution of wires in a first layer in a bottom-stage wiring substrate in the semiconductor device illustrated in FIG. 6.
Figure 8:
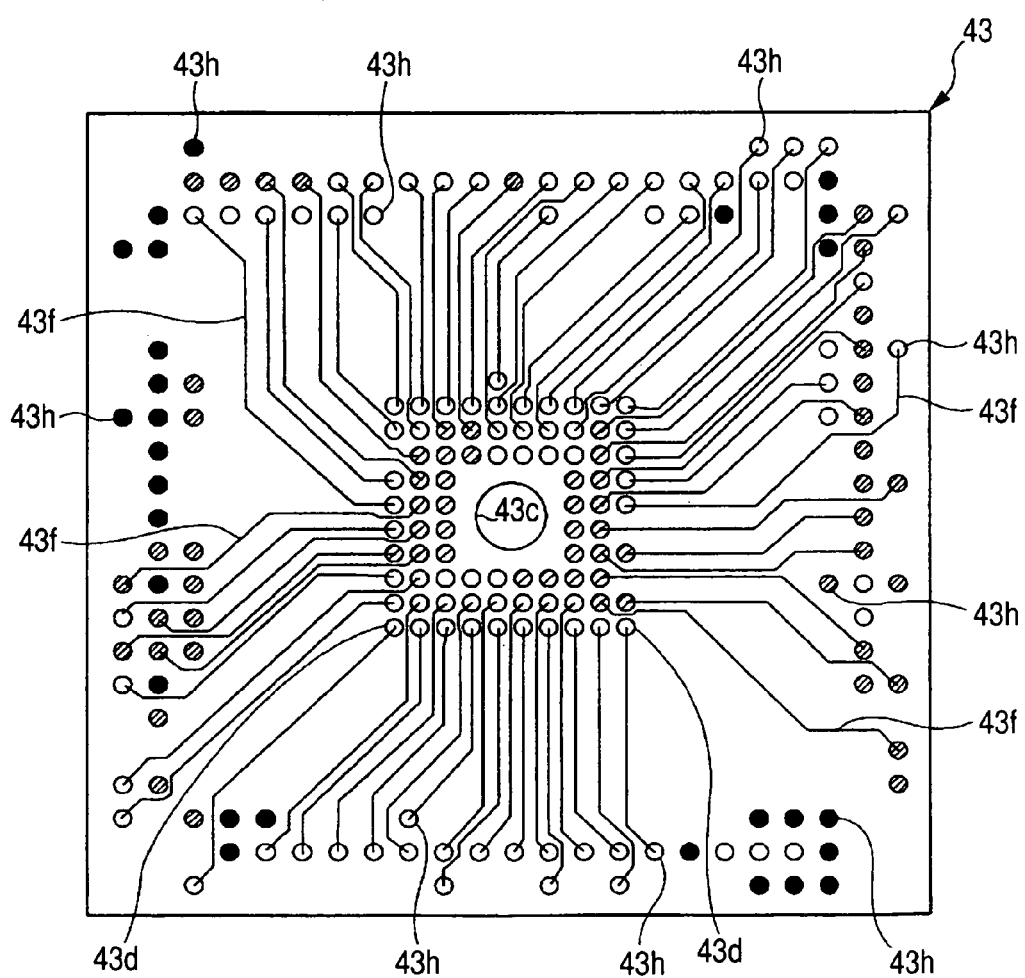
FIG. 8 is a plan view showing an example of the distribution of wires in a second layer in the bottom-stage wiring substrate in the semiconductor device illustrated in FIG. 6.
Figure 9:
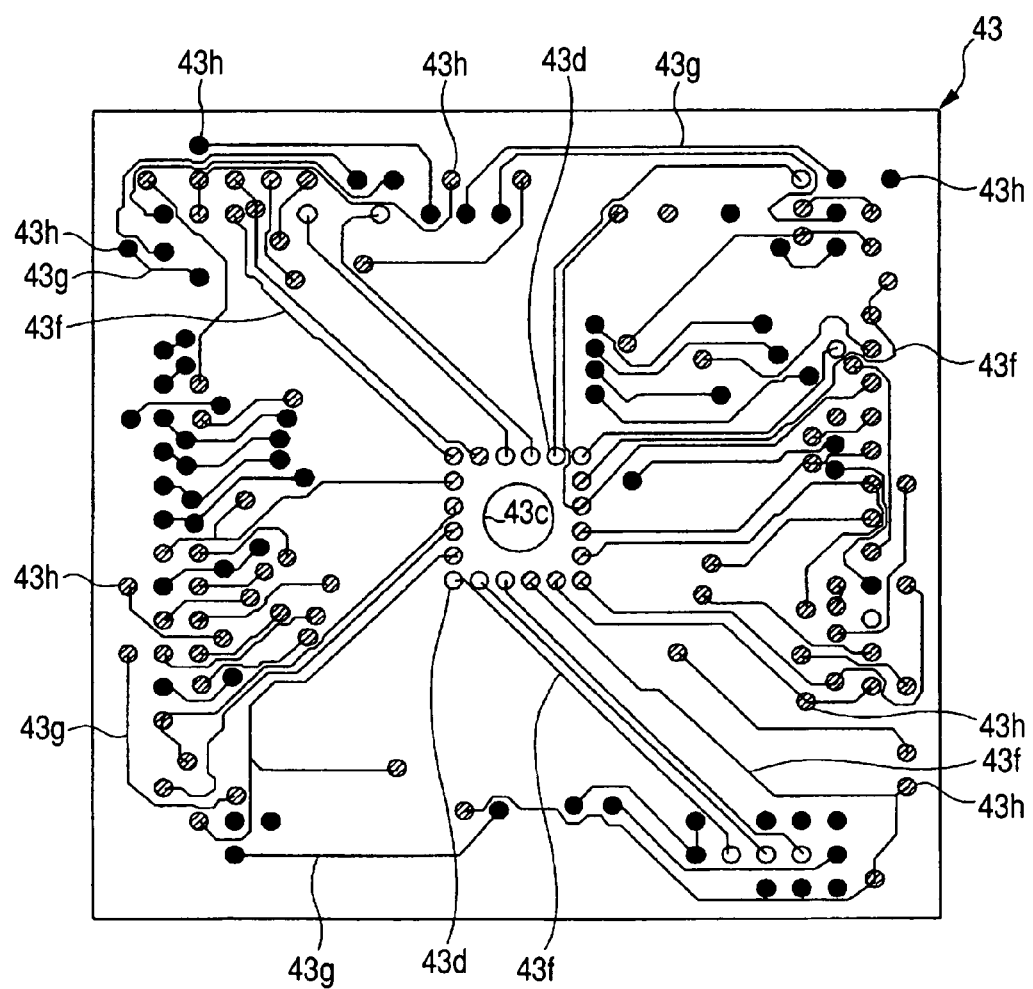
FIG. 9 is a plan view showing an example of the distribution of wires in a third layer in the bottom-stage wiring substrate in the semiconductor device illustrated in FIG. 6.
Figure 10:
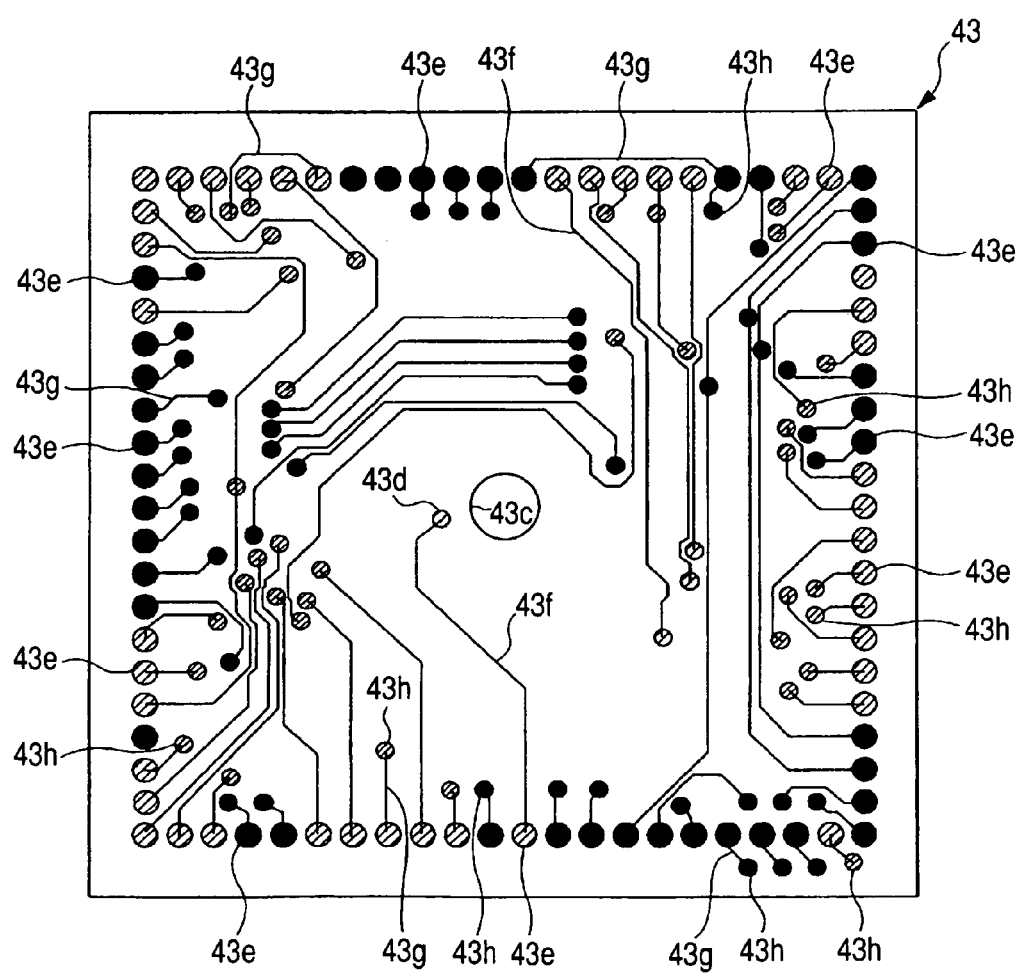
FIG. 10 is a plan view showing an example of the distribution of wires in a fourth layer in the bottom-stage wiring substrate in the semiconductor device illustrated in FIG. 6.
Figure 11:
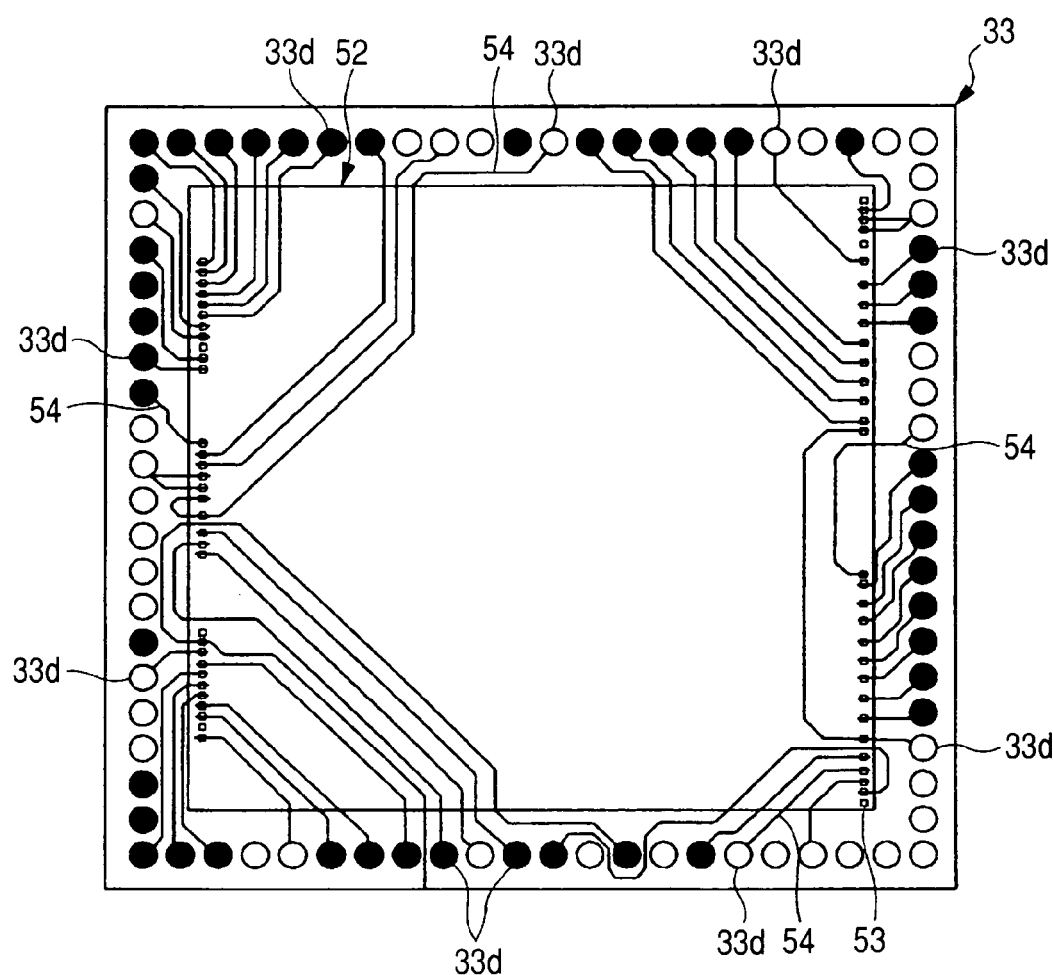
FIG. 11 is a plan view showing an example of the distribution of wires in a top-stage wiring substrate in a semiconductor device of a six-layer structure.
Figure 12:
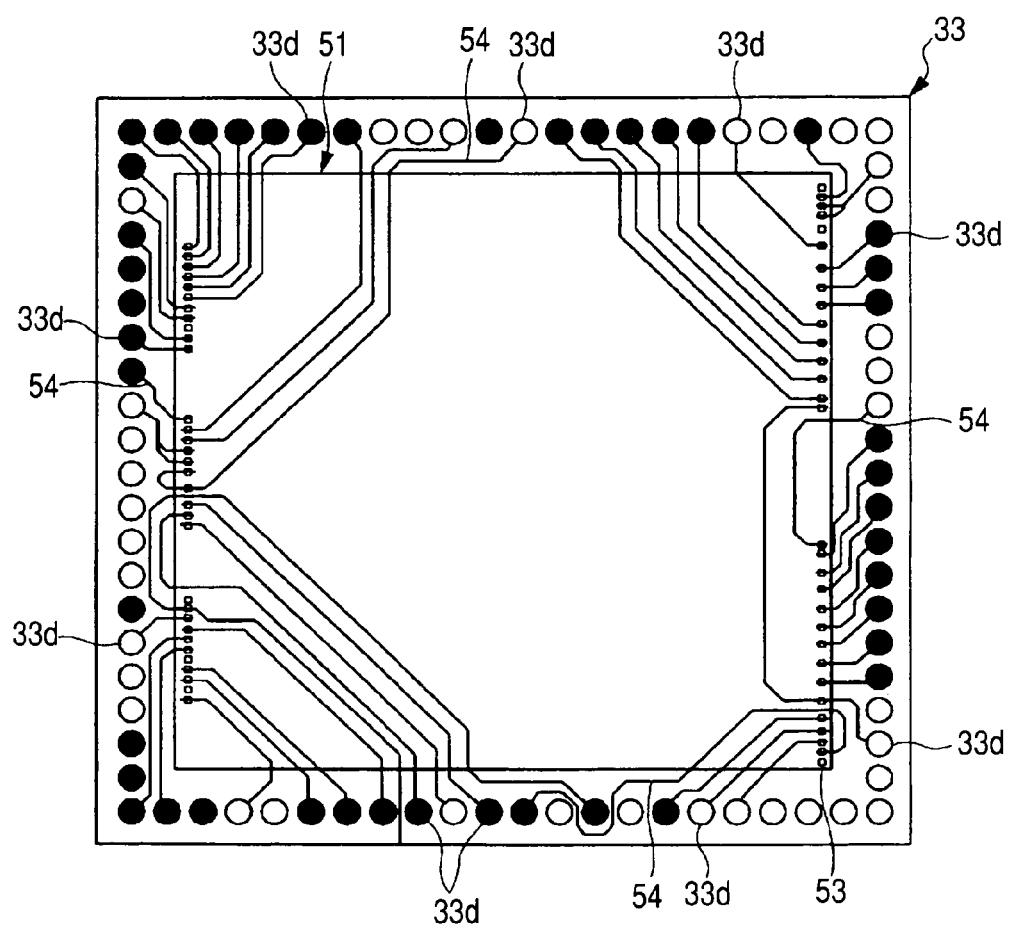
FIG. 12 is a plan view showing an example of the distribution of wires in a wiring substrate of the fifth stage from the bottom in the semiconductor device of a six-layer structure.
Figure 13:
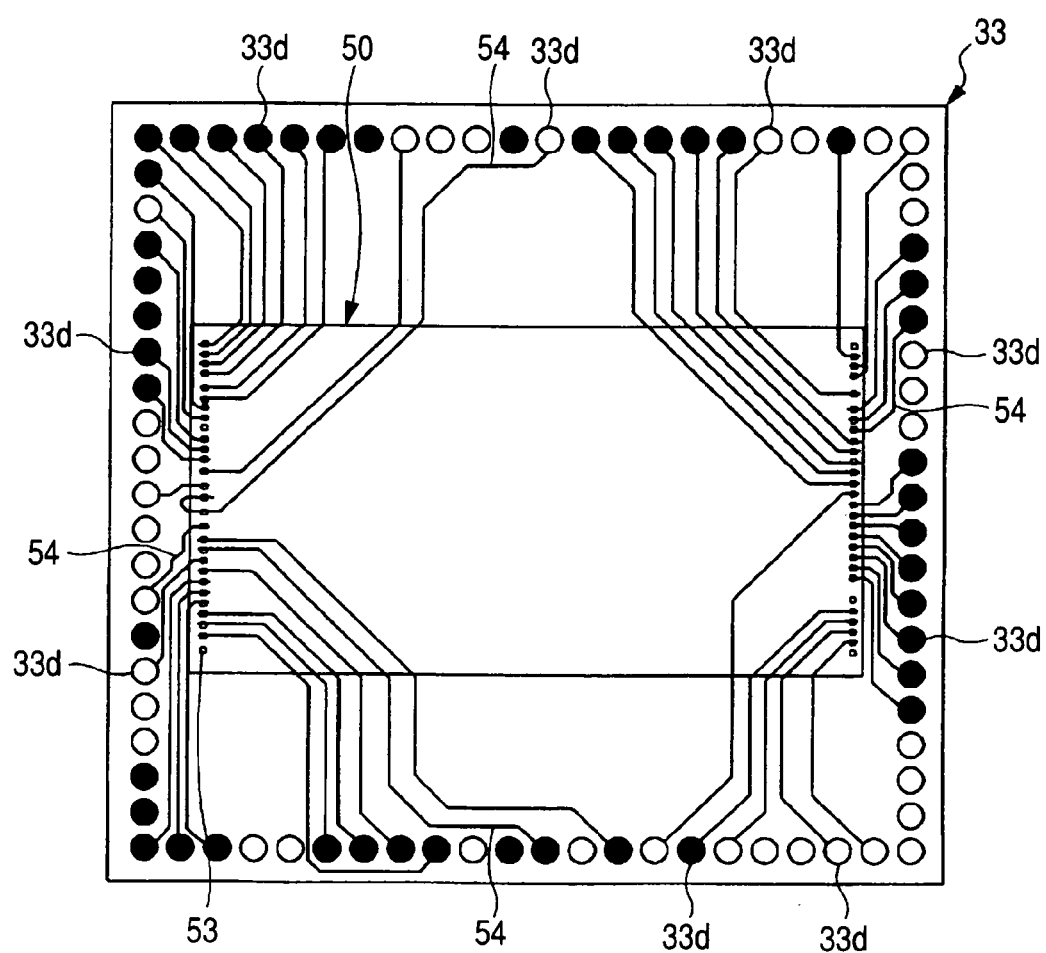
FIG. 13 is a plan view showing an example of the distribution of wires in a wiring substrate of the fourth stage from the bottom in the semiconductor device of a six-layer structure.
Figure 14:
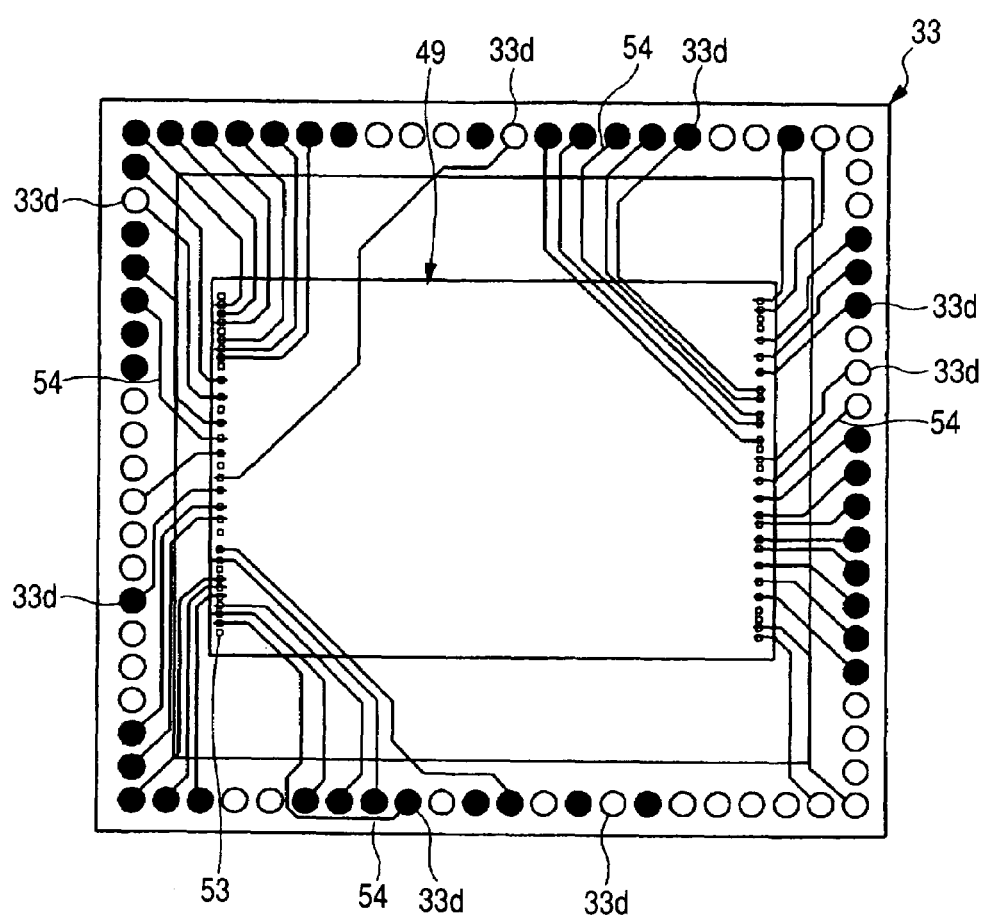
FIG. 14 is a plan view showing an example of the distribution of wires in a wiring substrate of the third stage from the bottom in the semiconductor device of a six-layer structure.
Figure 15:
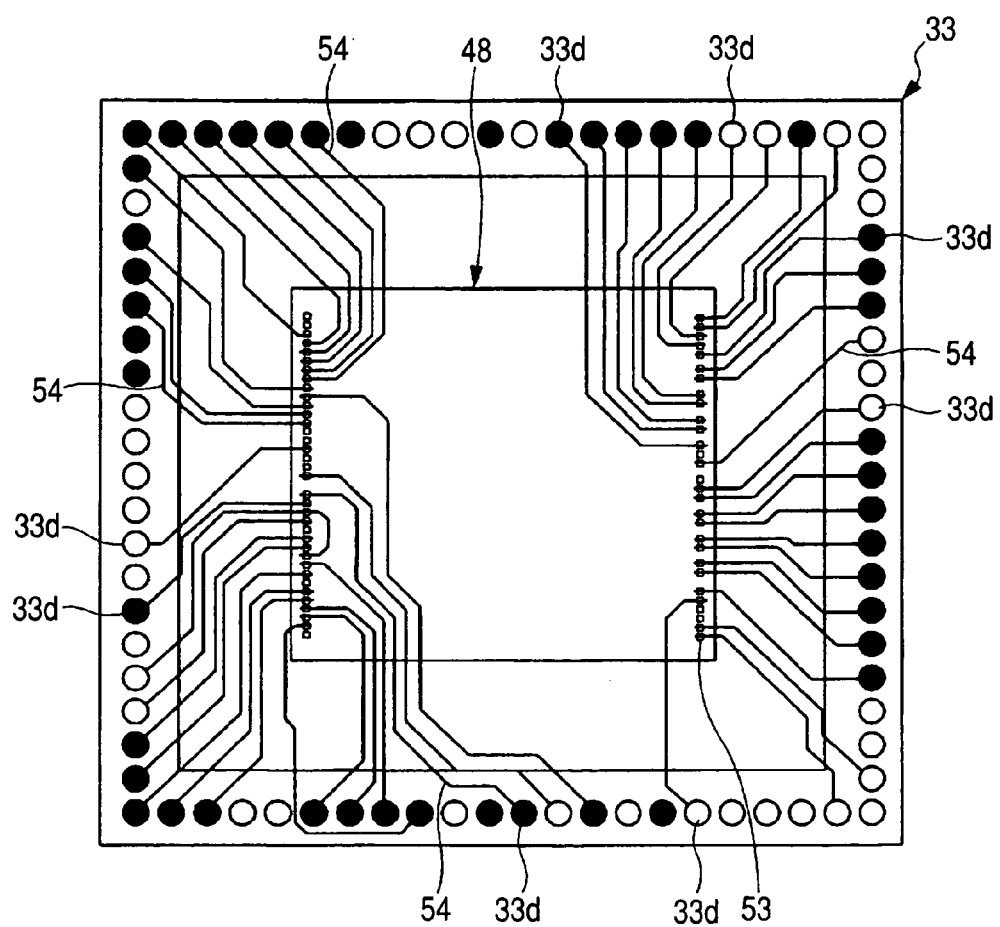
FIG. 15 is a plan view showing an example of the distribution of wires in a wiring substrate of the second stage from the bottom in the semiconductor device of a six-layer structure.

FIG. 6 is a sectional view showing a structural example of a semiconductor device according to a second embodiment of the present invention; FIG. 7 is a plan view showing an example of the distribution of wires in a first layer in a bottom-stage wiring substrate in the semiconductor device illustrated in FIG. 6; FIG. 8 is a plan view showing an example of the distribution of wires in a second layer in the bottom-stage wiring substrate in the semiconductor device illustrated in FIG. 6; FIG. 9 is a plan view showing an example of the distribution of wires in a third layer in the bottom-stage wiring substrate in the semiconductor device illustrated in FIG. 6; FIG. 10 is a plan view showing an example of the distribution of wires in a fourth layer in the bottom-stage wiring substrate in the semiconductor device illustrated in FIG. 6; FIG. 11 is a plan view showing an example of the distribution of wires in a top-stage wiring substrate in a semiconductor device of a six-layer structure; FIG. 12 is a plan view showing an example of the distribution of wires in a wiring substrate of the fifth stage from the bottom in the semiconductor device of a six-layer structure; FIG. 13 is a plan view showing an example of the distribution of wires in a wiring substrate of the fourth state from the bottom in the semiconductor device of a six-layer structure; FIG. 14 is a plan view showing an example of the distribution of wires in a wiring substrate of the third stage from the bottom in the semiconductor device of a six-layer structure; and FIG. 15 is a plan view showing an example of the distribution of wires in a wiring substrate of the second stage from the bottom in the semiconductor device of a six-layer structure.

A semiconductor device according to the second embodiment of the present invention, which is illustrated in FIG. 6, is a stacked type package 46 constituted by a stack of plural semiconductor packages like the stacked type package 38 of the first embodiment. However, unlike the stacked type package 38 of the first embodiment wherein only the plural first package structures 32 are stacked, a second package structure 44 having a multi-layer substrate (wiring substrate) 43 is disposed as a bottom substrate and plural (three in this second embodiment) stages of first package structures 32 are stacked thereon.

Thus, the stacked package 46 of this second embodiment has a stacked structure consisting of a total of four stages of packages.

The multi-layer substrate (first wiring substrate) 43 in the second package structure 44 of the lowest layer has a larger number of wiring layers and, hence, is thicker than the other package substrates 33 (other wiring substrates, or second wiring substrates) in the second- and higher-stage first package structures 32. For example, the wiring layers on the package substrate 33 in each first package structure 32 are provided as two layers formed on the surface and the back surface, respectively, of the substrate, while the multi-layer substrate 43 in the second package structure 44 has a four-layer wiring structure such as shown in FIGS. 7 to 10.

Also, in the second package structure 44, a first-stage chip (first semiconductor chip) 47 is flip-chip-connected to the multi-layer substrate 43 through solder bumps 45, and a through hole 43c is formed nearly centrally of the first-stage chip 47 on the multi-layer substrate 43 for the injection of resin through the through hole 43c from a back surface (first main surface) 43b side opposite to a surface 43a side (the flip-chip-connected side) which serve as a second main surface of the multi-layer substrate 43 in the under-fill sealing step after the flip-chip connection in assembly.

In the second package structure 44, as shown in FIG. 6, plural solder balls 35 which serve as external terminals are provided in plural rows (e.g., three rows) outside and around the first-stage chip 47 mounted by flip-chip connection. The solder balls 35 are provided on the same side as the side where the first-stage chip 47 is mounted. That is, the second package structure 44 is formed as a fan-out type package structure.

The first-stage chip 47 having logic/ASIC, for example, is incorporated in the second package structure 44 disposed in the bottom stage, and in the first package structure 32 which is stacked on the second package structure 44, a second-stage chip (another semiconductor chip, or a second semiconductor chip) 48 which serves as a second-stage semiconductor chip mainly having a memory chip is flip-chip-connected to the package substrate 33 through gold bumps 31c.

Further, in the first package structure 32 of the third stage, a third-stage chip (another semiconductor chip) 49 which serve as a third-stage semiconductor chip is flip-chip-connected to the package substrate 33 through gold bumps 31c. Likewise, in the first package structure 32 of the fourth stage, a fourth-stage chip (another semiconductor chip) 50 serving as a fourth-stage, or top-stage, semiconductor chip is flip-chip-connected to the package substrate 33 through gold bumps 31c.

In the stacked type package 46 of this second embodiment, the second-, third- and fourth-stage chips 48, 49, 50 are each provided with a memory circuit. The solder balls 37 which serve as salient electrodes formed on the second- and higher-stage package substrates 33 are of the same terminal type and arrangement so that they can be connected in each stage with the overlying and underlying stages.

Further, connecting wires 43g (see FIG. 9) for connection between solder balls 37 which are electrically connected in the same arrangement from the second to the fourth stage and corresponding solder balls 35 which serve as external terminals in the second package structure 44 are all formed on the bottom-stage multi-layer substrate 43.

For example, wires for connection of the solder balls 37 which serve as salient electrodes formed on the first package structure 32 of the fourth stage with the solder balls 35 which serve as external terminals in the stacked type package 46 are not formed on the package substrates 33 of the second and third stages, but a direct connection is provided through the solder balls 37 in the associated stages from the first package structure 32 of the fourth stage to the back surface 43b of the first-stage multi-layer substrate 43, and connecting wires 43g are formed on the bottom-stage multi-layer substrate 43.

In the stacked type package 46 of this second embodiment, the number of wiring layers in the bottom-stage multi-layer substrate 43 is larger than that in each of the second- and higher-stage package substrates 33, thus permitting the connecting wires 43g to be formed on the bottom-stage multi-layer substrate 43. Consequently, it is possible to facilitate distribution of the wires in the second- and higher-stage package substrates 33.

More particularly, in the package substrates 33 of the second- and higher-stage first package structures 32 in the stacked type package 46, only wires (wires between chip and solder balls 37) for each package (chip) are formed without forming wires for connection to the solder balls 35 which serve as external terminals, which wires for connection to the solder balls 35 are all formed on the multi-layer substrate 43 of the second package structure 44 in the bottom stage, which has a larger number of wiring layers.

For example, in the case where the multi-layer substrate 43 has a four-layer wiring structure and the second- and higher-stage package substrates 33 each have two surface and back wiring layers, a first-stage chip 47 having logic/ASIC is incorporated in the second package structure 44 of the bottom stage and a memory chip is incorporated in each the second- and higher-stage first package structures 32; whereby, in the multi-layer substrate 43, it becomes possible to distribute wires to external terminals in three layers out of the four wiring layers, and the remaining one layer can be used for the distribution of other wires.

When a comparison is made between a memory chip and a logic chip, generally the memory chip is larger in size and has a smaller number of pins than the logic chip. Also, as to the circuit layout, the logic chip is more complicated than the memory chip. That is, in the case of the memory chip, address and data are clearly separated from each other, so that it is possible to distribute wires easily, while the logic chip large number of pins and is complicated in circuit layout.

Therefore, in the stacked type package 46 of this second embodiment, a logic chip having a large number of pins is mounted on the bottom multi-layer substrate 43 having a large number of wiring layers and a memory chip having a small number of pins is mounted on each of the second- and higher-stage package substrates 33, whereby connecting wires (43g) of the second- and higher-stage package substrates 33 are drawn out to the bottom multi-layer substrate 43 and the distribution of connecting wires to the solder balls 35 which serve as external terminals is made in wiring layers of the multi-layer substrate 43.

As a result, in the second- and higher-stage package substrates 33, the distribution of wires can be done easily, and, also, in the bottom multi-layer substrate 43, the distribution of wires to external terminals can be done in three layers out of the four wiring layers described above and the remaining one layer can be used for distribution of other wires.

For example, the remaining one layer may be used for mounting of another semiconductor element, a passive component or a socket and for distribution of wires in its wiring, or it may be used as a part of wiring on the mounting substrate (see FIG. 2) for mounting the stacked type package 46 to provide connection from external terminal to external terminal.

Thus, in the stacked type package 46 of this second embodiment, the substrate with logic/ASIC chip mounted thereon has a larger number of wiring layers than the memory chip-mounting substrates, whereby distribution of wires becomes easier, and, consequently, it is possible to have wires not used for distribution to external terminals.

Consequently, a part of the wiring in the wiring layers can be used for distribution of wires for another semiconductor element, a passive component or a socket in a mounted state thereof. As a result, it is possible to attain a high-density packaging of the semiconductor device (stacked type package 46).

Moreover, since it becomes possible to mount another semiconductor element, a passive component or a socket, a high-function semiconductor device (stacked type package 46) can be implemented at a low cost.

Further, since the multi-layer substrate 43 having four wiring layers is used in the stacked type package 46 and other first package structures 32 are stacked on the multi-layer substrate 43, it is possible to prevent warping of the stacked type package 46, and, hence, it is possible to improve the substrate packaging characteristic on the user side.

FIGS. 7 to 10 show examples of the distribution of wires in the wiring layers of the multi-layer substrate 43, of which FIG. 7 shows distribution of wires in the first layer from the bottom, FIG. 8 shows distribution of wires in the second layer from the bottom, FIG. 9 shows distribution of wires in the third layer from the bottom, and FIG. 10 shows distribution of wires in the fourth layer from the bottom.

In the first wiring layer shown in FIG. 7, for flip-chip connection to the first-stage chip 47 through solder bumps 45 and for connection to solder balls 35 which serve as external terminals of the stacked type package 46, plural inner lands 43d serving as electrodes for flip-chip connection are arranged lattice-like in a central area and plural outer lands 43e serving as electrodes for connection to solder balls 35 are arranged in three rows in a peripheral area.

In connection with the inner lands 43d, outer lands 43e and through holes 43h shown in FIGS. 7 to 10, black electrodes represent memory-alone electrodes, white electrodes represent logic-alone electrodes, and hatched electrodes represent common electrodes, such as a power supply/GND.

In the first wiring layer shown in FIG. 7, there are formed plural lead-out wires 43f for connection between two outer rows of the inner lands 43d for flip-chip connection and the outer lands 43e for connection to solder balls 35. The lead-out wires 43f formed in the first wiring layer are mainly lead-out wires for logic, and there also are lead-out wires 43f for common electrode, such as power supply/GND, although the number thereof is small.

In the second wiring layer shown in FIG. 8, there are plural through holes 43h, and inner lands 43d for logic and for flip-chip connection and through holes 43h for logic and for outer land connection, as well as inner lands 43d for common electrode and for flip-chip connection and through holes 43h for common electrode and for outer land connection, are respectively connected together through lead-out wires 43f.

In the third wiring layer shown in FIG. 9, there are plural through holes 43h, and inner lands 43d for logic and for flip-chip connection and through holes for logic and for outer land connection, as well as inner lands 43d for common electrode and for flip-chip connection and through holes 43h for common electrode and for outer land connection, are respectively connected together through lead-out wires 43f. Further, through holes 43h for memory (black) are connected together through connecting wires 43g and through holes 43h for power supply/GND (hatched) are connected together through connecting wires 43g.

In the fourth wiring layer shown in FIG. 10, there are plural outer lands 43e for connection to solder balls 37, the outer lands 43e being arranged side by side in a peripheral area of the wiring layer, as well as plural through holes 43h. The outer lands 43e and the through holes 43h are connected together through connecting wires 43g. Further, inner lands 43d for flip-chip connection and outer lands 43e are connected together through lead-out wires 43f. No wires for logic are formed in the fourth wiring layer.

The following description is provided concerning the wirings shown in FIGS. 11 to 15.

FIGS. 11 to 15 show the distributions of wires in wiring layers of package substrates 33 in a stacked type package 46 of a six-layer package structure with various types of memory circuits incorporated in the second- and higher-stage chips from the bottom.

FIG. 11 shows an example of the wiring in the sixth-, or top-stage, package substrate 33 and a sixth-stage chip (another semiconductor chip) 52 mounted on the substrate. For example, a flash memory circuit is incorporated in the sixth-stage chip 52. In this wiring layer, as shown in the same figure, there are connecting wires 54 for connection between pads 53 serving as surface electrodes on the sixth-stage chip 52 and corresponding lands 33d. In the lands 33d shown in FIGS. 11 to 15, black electrodes represent 5-chip common pins, while white electrodes represent chip-alone pins.

FIG. 12 shows an example of the wiring in the fifth-stage package substrate 33 from the bottom and the fifth-stage chip (another semiconductor chip) 51 mounted on the substrate. For example, a flash memory circuit is incorporated in the fifth-stage chip 51. In this wiring layer, as shown in FIG. 12, there are connecting wires 54 for connection between pads 53 serving as surface electrodes on the fifth-stage chip 51 and corresponding lands 33d.

FIG. 13 shows an example of the wiring in the fourth-stage package substrate 33 from the bottom and a fourth-stage chip (another semiconductor chip) 50 mounted on the substrate. For example, another flash memory circuit is incorporated in the fourth-stage chip 50. In this wiring layer, as shown in FIG. 13, there are connecting wires 54 for connection between pads 53 serving as surface electrodes on the fourth-stage chip 50 and corresponding lands 33d.

FIG. 14 shows an example of the wirings in the third-stage package substrate 33 from the bottom and a third-stage chip (another semiconductor chip) 49 mounted on the substrate. For example, a SRAM (Static Random Access Memory) circuit is incorporated in the third-stage chip 49. In this wiring layer, as shown in FIG. 14, there are connecting wires 54 for connection between pads 53 serving as surface electrodes on the third-stage chip 49 and corresponding lands 33d.

FIG. 15 shows an example of the wirings in the second-stage package substrate 33 from the bottom and a second-stage chip (another semiconductor chip) 48 mounted on the substrate. For example, a pseudo SRAM (Pseudo Static Random Access Memory) circuit is incorporated in the second-stage chip 48. In this wiring layer, as shown in FIG. 15, there are connecting wires 54 for connection between pads 53 serving as surface electrodes on the second-stage chip 48 and corresponding lands 33d.

In the stacked type package 46 of the second embodiment, as shown in FIGS. 11 to 15, it is possible to facilitate the distribution of wires in the second- and higher-stage package substrates 33.

It is preferable that a chip having a memory circuit be mounted on each of the second- and higher-stage package substrates 33. In this case, it is optional whether the number of memory circuits is to be one or plural.

Third Embodiment

Figure 16:
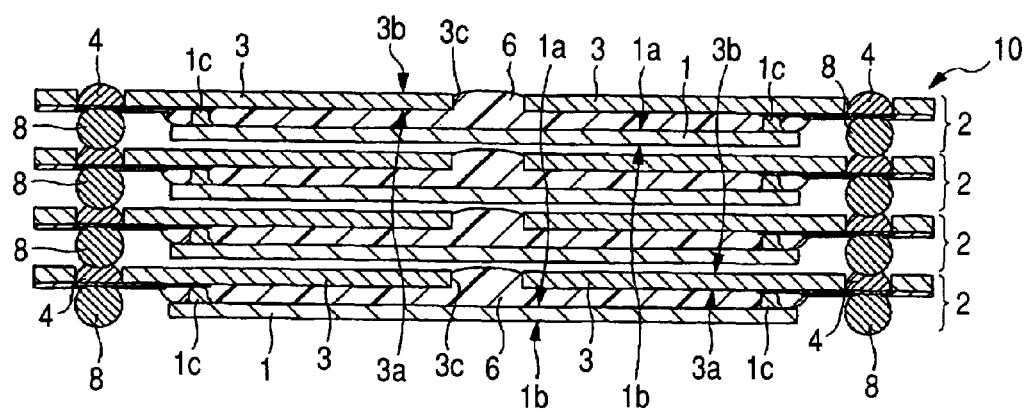
FIG. 16 is a sectional view showing a structural example of a semiconductor device according to a third embodiment of the present invention.
Figure 17:
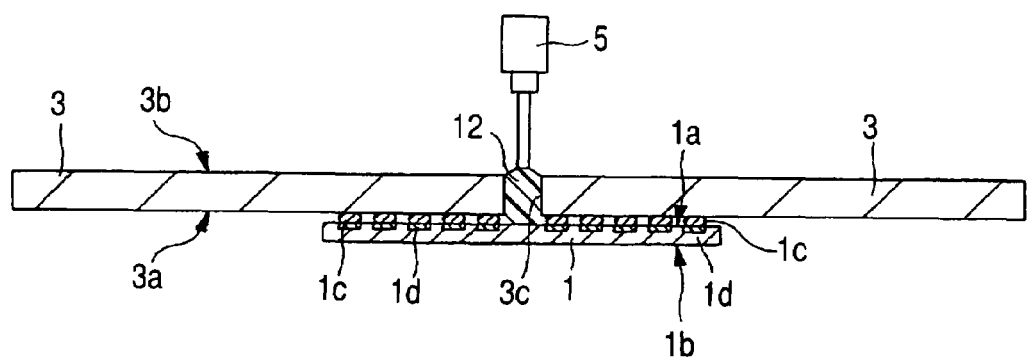
FIG. 17 is a sectional view showing an example of an under-fill sealing method in assembling the semiconductor device illustrated in FIG. 16.
Figure 18:
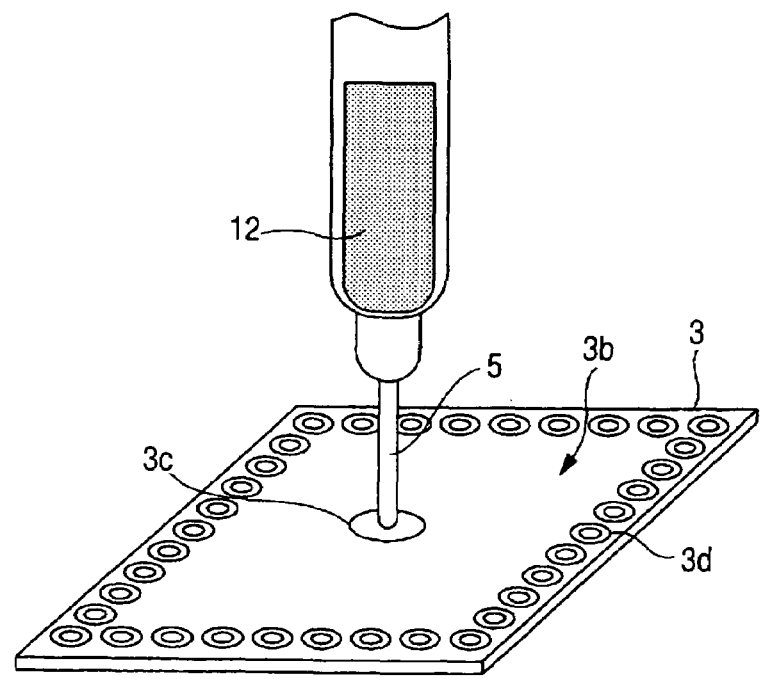
FIG. 18 is a partial perspective view showing the under-fill sealing method illustrated in FIG. 17.
Figure 19:
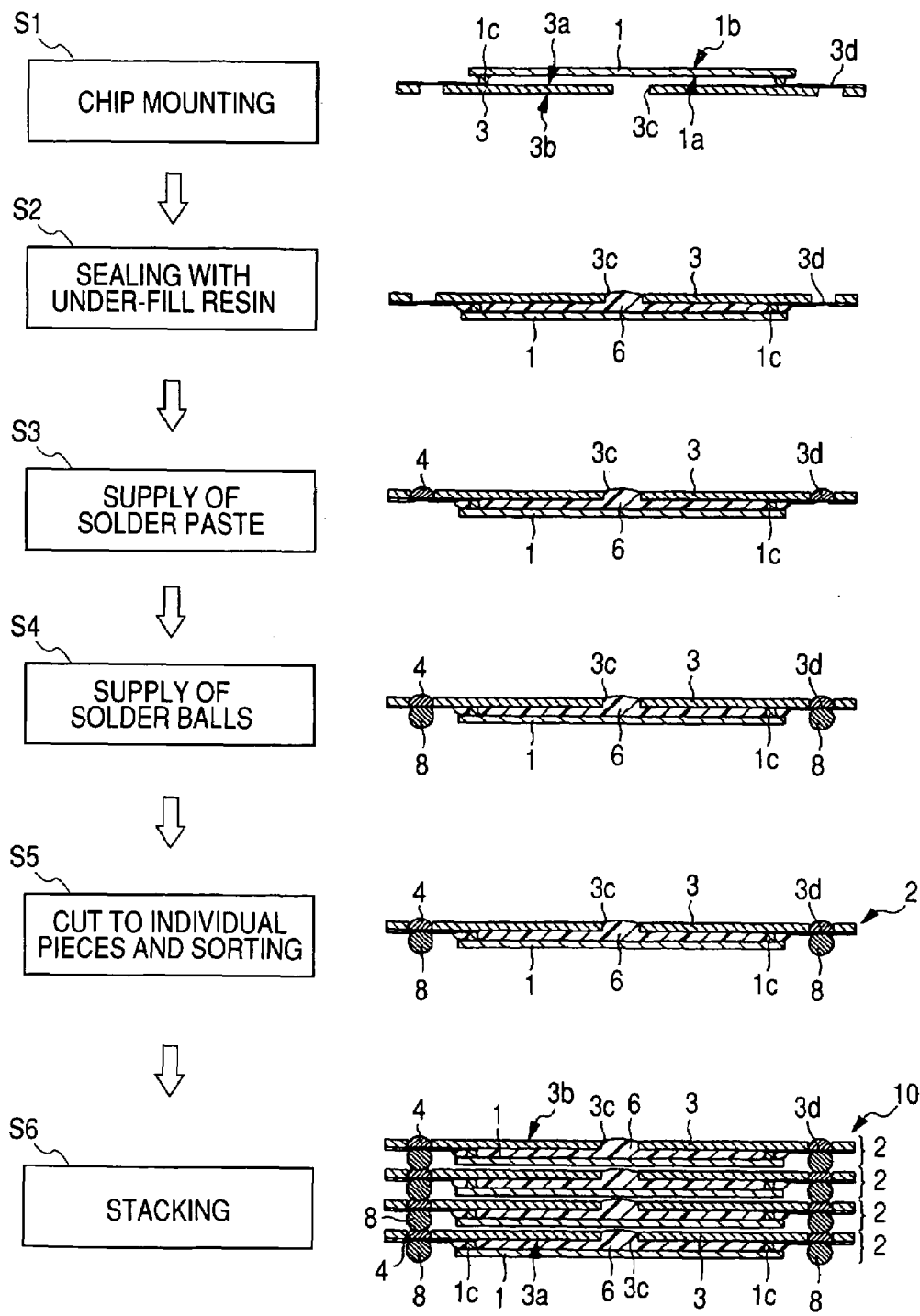
FIG. 19 is a manufacturing process flow chart showing an example of a procedure for assembling the semiconductor device illustrated in FIG. 16.
Figure 20:
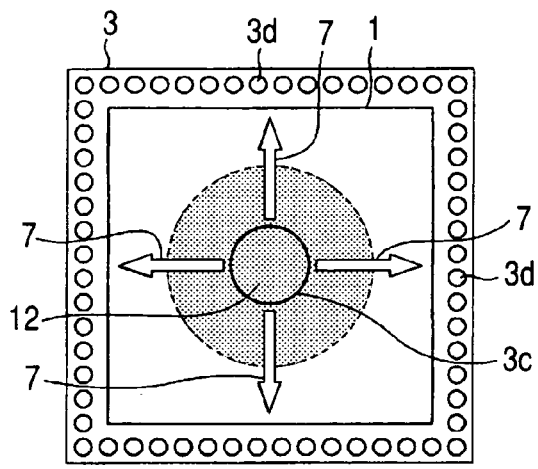
FIG. 20 is a plan view showing an example of a state of resin diffusion by the under-fill sealing method illustrated in FIG. 18.
Figure 21:
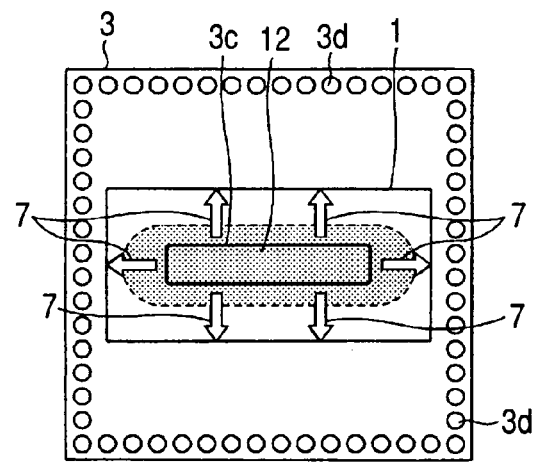
FIG. 21 is a plan view showing a state of resin diffusion by the under-fill sealing method in case of using a wiring substrate according to a modification of the third embodiment.
Figure 22:
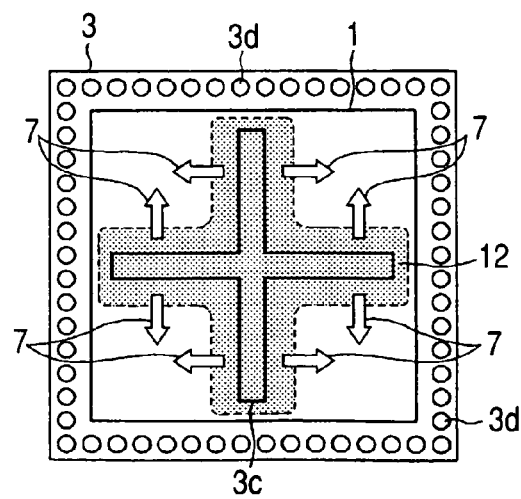
FIG. 22 is a plan view showing a state of resin diffusion by the under-fill sealing method in case of using a wiring substrate according to another modification of the third embodiment.
Figure 23:
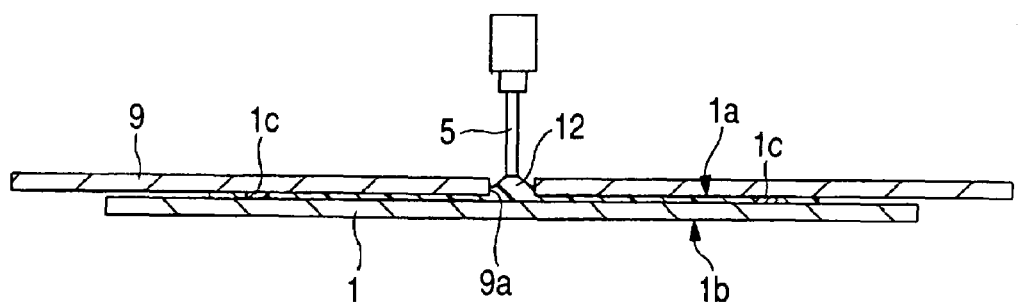
FIG. 23 is a sectional view showing the under-fill sealing method in case of using a wiring substrate according to a further modification of the third embodiment.
Figure 24:
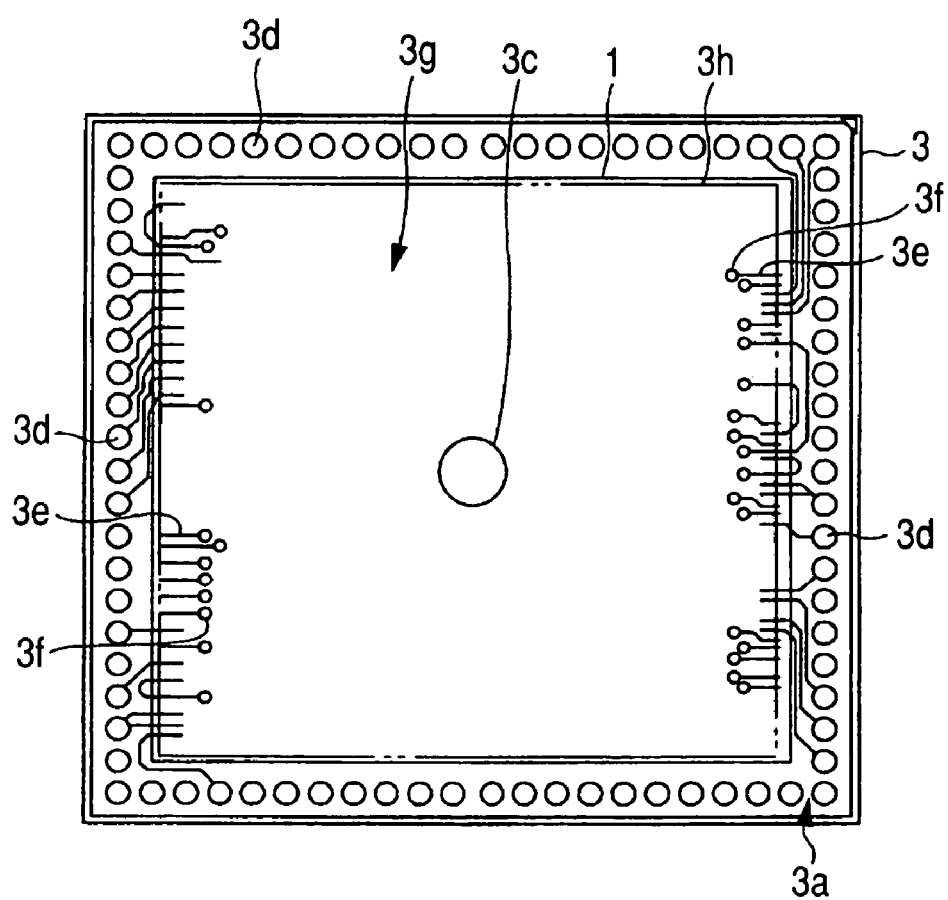
FIG. 24 is a plan view showing a surface-side structure of a wiring substrate according to a still further modification of the third embodiment.
Figure 25:
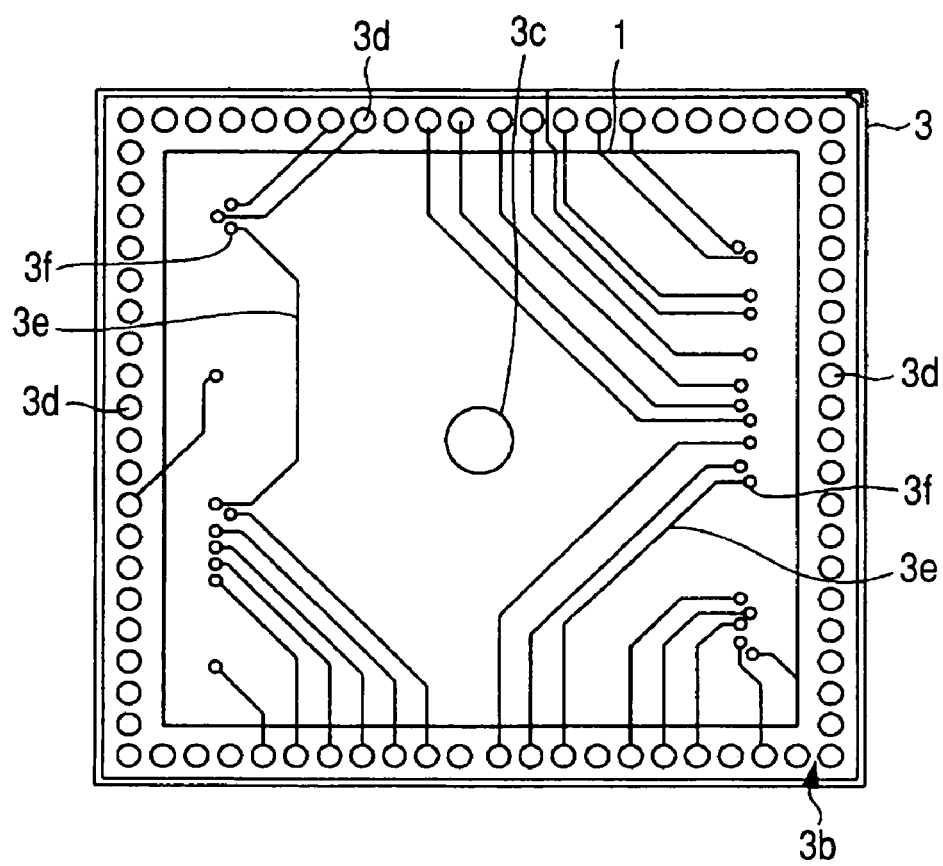
FIG. 25 is a back view showing a back surface-side structure of the wiring substrate illustrated in FIG. 24.

FIG. 16 is a sectional view showing a structural example of a semiconductor device according to a third embodiment of the present invention; FIG. 17 is a sectional view showing an example of an under-fill sealing method used in assembling the semiconductor device illustrated in FIG. 16; FIG. 18 is a partial perspective view showing the under-fill sealing method illustrated in FIG. 17; FIG. 19 is a manufacturing process flow chart showing an example of a procedure for assembling the semiconductor device illustrated in FIG. 16; FIG. 20 is a plan view showing an example of a state of resin diffusion produced by the under-fill sealing method illustrated in FIG. 18, FIG. 21 is a plan view showing a state of resin diffusion by the under-fill sealing method in case of using a wiring substrate according to a modification of the third embodiment; FIG. 22 is a plan view showing a state of resin diffusion produced by the under-fill sealing method in case of using a wiring substrate according to another modification of the third embodiment; FIG. 23 is a sectional view showing the under-fill sealing method in case of using a wiring substrate according to a further modification of the third embodiment; FIG. 24 is a plan view showing the surface-side structure of a wiring substrate according to a still further modification of the third embodiment; and FIG. 25 is a back view showing the back surface-side structure of the wiring substrate illustrated in FIG. 24.

The semiconductor device of this third embodiment is a stacked type package 10 wherein a semiconductor chip 1 is flip-chip-connected to a wiring substrate and plural such structures are stacked.

More specifically, the semiconductor device of this third embodiment is a module product of a stacked structure wherein, on a first package substrate 2 comprising a semiconductor chip 1 that is flip-chip-connected to a wiring substrate, one or plural other first package structures 2 of the same structure are stacked.

A description will now be given concerning the detailed structure of the stacked type package 10 shown in FIG. 16. The stacked type package 10 has a total of four stages of package structures comprising a first package structure 2 disposed in the lowest stage and three other first package structures 2 stacked thereon in three stages.

The construction of the first package structure 2 will be described first. The first package structure 2 comprises a package substrate 3 formed as a thin wiring substrate, a semiconductor chip 1 mounted by flip-chip connection onto a surface 3a of the package substrate 3, plural gold bumps 1c serving as salient electrodes for connection between the semiconductor chip 1 and the package substrate 3, a sealing portion 6 for protecting the flip-chip connections using the gold bumps 1c and for mitigating a difference in thermal expansion quantity between the chip and the substrate, and plural solder balls 8 serving as external terminals arranged outside and around the semiconductor chip 1 on the package substrate 3.

Thus, the package structure in question is a fan-out type package structure wherein the surface 3a of the package substrate 3 and a main surface 1a of the semiconductor chip 1 are opposed to each other and are electrically connected with each other through gold bumps 1c; further, the flip-chip connections are sealed with resin by an under-fill sealing method, and plural solder balls 8 are arranged as external terminals outside and around the semiconductor chip 1.

For example, the package substrate 3 has a thin two-layer wiring structure wherein plural lands 3d serving as electrodes for mounting the solder balls 8 are arranged side by side in an outer periphery area of the substrate, and plural solder balls 8 are arranged side by side in a quadrangular form so as to surround the outside of the semiconductor chip 1 when the solder balls 8 are attached to the lands 3d. In this case, the plural solder balls 8 are each disposed in proximity to the semiconductor chip 1 for attaining a reduction in the size of the stacked type package 10.

A through hole 3c which opens to both surface 3a and back surface 3b of the package substrate 3 are formed nearly centrally of a chip mounting area 3h of the surface 3a. In sealing the flip-chip connections by an under-fill sealing method at the time of assembling the stacked type package 10 to form a semiconductor device, a sealing resin 12 is injected into the through hole 3c from the back surface 3b side of the package substrate 3 so as to be fed between the semiconductor chip 1 and the package substrate 3, as shown in FIG. 17.

Therefore, in the package substrate 3, as shown in FIGS. 18 and 20, it is preferable that the through hole 3c be formed at a position corresponding to a central part of the chip, including a point of intersection of two diagonal lines on the main surface 1a of the semiconductor chip 1, whereby the sealing resin 12 when injected through the through hole 3c can be dispersed almost uniformly, so that diffusing directions 7 (see FIG. 20) of the sealing resin 12 cover the whole circumference (360°). Besides, the sealing resin 12 can be fed in almost equal quantities and speeds throughout the whole circumference.

Moreover, since individual semiconductor device structures are stacked in the stacked type package 10, the semiconductor chip 1 in each first package structure 2 is formed lower than the solder balls 8 with respect to the package substrate 3.

In other words, in each semiconductor device structure, the height of the back surface 1b of the semiconductor chip 1 from the package substrate 3 is lower than the height from the package substrate 3 up to the top of each solder ball 8, whereby, at the time of stacking semiconductor device structures, the structures can be stacked positively without contact of the back surface 1b of the semiconductor chip 1 with the package substrate 3 of the overlying or underlying semiconductor device structure.

In the stacked type package 10, for attaining the reduction in thickness of the stacked structure, solder balls 8 are provided on the package substrate 3 on the same side as the semiconductor chip 1-mounted side.

That is, in the case where the semiconductor chip 1 is flip-chip-connected to the surface 3a of the package substrate 3, solder balls 8 are mounted on the same surface 3a. By so doing, when another first package structure 2 is stacked on the first package structure 2, the semiconductor chip 1 is disposed on the lower side of the package substrate 3 overlying another first package structure 2, that is, the semiconductor chip 1 does not project on the package substrate 3, so that it is possible to reduce the thickness of the stacked type package 10.

Moreover, in the stacked type package 10 of this third embodiment, the semiconductor chip 1 having a polished back surface 1b is flip-chip-connected to the package substrate in each semiconductor device structure, whereby the thickness of the stacked type package 10 can be reduced. The thickness of the semiconductor chip 1, which is polished on its back surface 1b side, for example, is 90 μm or so.

The spacing between the flip-chip-connected semiconductor chip 1 and package substrate 3 is, for example, 30 to 50 μm or so, which is very narrow. The gold bumps 1c serving as salient electrodes for flip-chip connection are, for example, stud bumps formed by the application of a wire bonding technique. However, they may be bump electrodes formed by plating or solder.

The plural solder balls 8 attached to each first package structure 2 include pins serving as external terminals in the stacked type package 10 and pins for connection to the underlying other first package structure 2.

Next, with reference to the manufacturing process flow chart of FIG. 19, a description will be given below concerning a method for manufacturing the stacked type package 10 of this third embodiment.

First, a package substrate 3 formed as a wiring substrate having a through hole 3c located nearly centrally of the chip mounting area 3h (see FIG. 4) is provided. In addition, a semiconductor chip 1 is provided wherein gold bumps 1c as salient electrodes for flip-chip connection are attached to pads 1d (see FIG. 17) which serve as surface electrodes of a chip main surface 1a. The salient electrodes may be bump electrodes formed by plating or solder.

Thereafter, chip mounting as shown in step S1 in FIG. 19 is performed. More specifically, a surface 3a of the package substrate 3 and the main surface 1a of the semiconductor chip 1 are disposed in opposition to each other, and thermocompression bonding is performed in this state to effect flip-chip connection by a Au (gold)—Au (gold) connection or a Au (gold)—Sn (tin) connection. However, in the case where the salient electrodes are bump electrodes formed by solder, the flip-chip connection is performed by reflow.

Thereafter, in step S2, sealing is conducted using an under-fill resin.

More specifically, as shown in FIGS. 17 and 18, an under-fill sealing resin 12 is injected dropwise from a back surface 3b side of the package substrate 3 into the through hole 3c with use of a nozzle 5 to feed the sealing resin 12 between the semiconductor chip 1a and the package substrate 3.

In this way, the sealing resin 12 is injected from the back surface 3b side of the package substrate 3 into the through hole 3c formed near the center of the chip mounting area 3h of the substrate to feed the resin between the semiconductor chip 1 and the package substrate 3. Thus, since the sealing resin 12 is poured from nearly the central part of the chip 1 into the space between the chip and the package substrate 3, it is possible to prevent the sealing resin 12 from adhering to the lands 3d formed outside the chip on the package substrate 3. Consequently, it is possible to improve the quality of the semiconductor device (stacked type package 10).

Further, since the sealing resin 12 is injected from the back surface 3b of the package substrate 3, there is no fear that the sealing resin may crawl up to the back surface 1b of the semiconductor chip 1, and another first package structure 2 can be stacked on the first package structure 2.

Particularly, in case of stacking package substrates 3 through solder balls 8, the prevention of crawling-up of the sealing resin 12 is very important for the reduction in size of the semiconductor device. In case of designing the semiconductor device in consideration of the possibility that the sealing resin 12 may crawl up to the back surface 1b of the semiconductor chip 1, it is necessary to make the design so that the spacing between adjacent package substrates has a sufficient margin in comparison with the original thickness of the semiconductor chip 1. Increasing the height of each solder ball 8 is essential for enlarging the spacing between adjacent package substrates 3. However, the solder balls 8 are melted at the time of their formation or connection, so that, for increasing their height, it is also necessary to increase their diameter in proportion thereto.

In the case where solder balls 8 are arranged around the semiconductor chip 1 as in the semiconductor device of this third embodiment, an increase in diameter of each solder ball 8 leads directly to an increase in size of the semiconductor device. In this connection, by injecting the sealing resin 12 from the back surface 3b of the package substrate 3 to prevent the sealing resin from crawling up to the back surface 1b of the semiconductor chip 1, as provided in the present invention, it is possible to set a narrow spacing between adjacent package substrates 3, and, hence, it is possible to attain a reduction in the size of solder balls 8.

Further, since the sealing resin 12 is injected from near the center of the chip, the sealing resin can be diffused outwards from the chip center, and it is possible to diminish the formation of voids caused by a roll-up phenomenon of the resin in comparison with the conventional method wherein the sealing resin is injected from a side face of the chip. Consequently, it is possible to improve the reliability of the stacked type package 10.

After the end of the resin sealing step, solder paste is supplied in step S3. In step S3, for connection of the solder balls 8 in the overlying first package structure 2, solder paste 4 is applied to lands 3d on the back surface 3b of the package substrate 3. As the solder paste 4 there is used a Pb-free solder, for example.

Subsequently, solder balls are supplied in step S4. In this step, solder balls 8 serving as external terminals are provided on plural lands 3d, which are arranged outside and around the semiconductor chip 1 on the package substrate 3.

More specifically, solder balls 8 are arranged on lands 3d formed on the same surface 3a as the chip-mounted surface of the package substrate 3 and are fixed to the lands 3d by reflow. In this way, in the semiconductor package 3, solder balls 8 are arranged on the same side as the chip-mounted side, and, hence, it is possible to attain a reduction in the thickness of the first package structure 2. As the solder paste 4, a Pb-free solder is used, for example.

Thereafter, cutting to individual pieces and sorting are performed in step S5. In this step, first package structures 2 are formed by cutting to individual pieces and plural first package structures 2 of a good quality are obtained by sorting.

Then, stacking is carried out in step S6. In this step, a first package structure 2 is disposed in the bottom stage and other first package structures 2 are stacked thereon in plural stages. The other first package structures 2 are completely the same in structure as the first package structure 2 of the bottom stage.

First, another first package structure 2 of the same structure as the bottom-stage first package structure 2 is stacked on the surface (back surface 3b) opposite to the solder balls 8-provided surface (surface 3a) of the package substrate 3 in the bottom-stage first package structure 2.

In this case, the stacking is performed while the lands on the package substrate 3 of the first package structure 2 in the bottom stage and the solder balls 8 in the overlying other first package structure 2 are aligned with one another.

Subsequently, still another first package structure 2 is stacked on, the other first package structure. This stacking operation is repeated plural times.

Thereafter, the solder balls 8 in the second- and higher-stage first package structures 2 and the lands 3d on the package structure of the underlying first package structure 2 are electrically connected with one another. The connection between the lands 3d and the solder balls 8 is effected by reflow.

In this way, the assembly of the stacked type package 10 of this third embodiment is completed.

A description will now be given of modifications of the third embodiment.

In the package structure shown in FIG. 20, a circular through hole 3c is formed nearly centrally of the package substrate 3, as noted above. The circular through hole 3c is applicable more effectively in the case of a square semiconductor chip 1. That is, since the distances from the through hole 3c to the four sides of the chip are equal, resin spreads isotropically by dropwise injection from the central part.

As a result, it is possible to diminish voids formed by a roll-up phenomenon of resin; besides, it is possible to shorten the resin injection time in comparison with applying the resin sideways of the chip. Moreover, the time required for injection of the sealing resin 21 can be further shortened by enlarging the diameter of the through hole 3c insofar as possible.

On the other hand, in a modification shown in FIG. 21, a through hole 3c is formed so that the shape of an opening portion thereof conforms to the contour shape of the main surface 1a of the semiconductor chip 1. That is, in the case where the semiconductor chip 1 is in a rectangular shape, the through hole 3c is also made rectangular so that the distances from the through hole to the four sides of the chip become equal like the shape shown in FIG. 20. By so doing, it is possible to diminish voids formed by a roll-up phenomenon of resin and shorten the time required for the injection of resin.

In a modification shown in FIG. 22, a through hole 3c is formed so that the shape of an opening portion thereof is a cross shape. Also, with this shape, it is possible to shorten the resin injection time.

According to a modification shown in FIG. 23, there is provided a package which adopts a filmy tape substrate 9 formed as a wiring substrate. Even with the structure using the tape substrate 9 formed with a through hole 9a, the same effects as described above can be obtained.

In a modification shown in FIGS. 24 and 25, a package substrate 3 has, on a surface 3a thereof, a flat portion 3g which has a size corresponding to the size of a semiconductor chip 1 and in which wires 3e are not formed. Further, a chip mounting area 3h on which the semiconductor chip 1 is mounted includes the flat portion 3g, and a through hole 3c is formed in the flat portion 3g. FIG. 24 shows the surface 3a side and FIG. 25 shows a back surfae 3b side.

That is, most of the chip mounting area 3h on the surface 3a is occupied by the flat portion 3g in which wirings 3e and through holes 3f are not formed. Wires 3e are formed on the back surface 3b side via through holes 3f.

A first package structure 2 is assembled using the package substrate 3 described above.

First, in a chip mounting step, the flat portion 3g in the chip mounting area 3h on the surface 3a of the package substrate 3 and the main surface 1a of the semiconductor chip 1 are positioned in opposition to each other, and, thereafter, the semiconductor chip 1 is flip-chip-connected to the chip mounting area 3h through gold bumps 1c.

In a subsequent sealing step, the sealing resin 12 is injected from the back surface 3b side of the package substrate 3 through the through hole 3c and is allowed to flow along the flat portion 3g of the surface 3a of the package substrate 3 so as to be filled in between the semiconductor chip 1 and the package substrate 3.

Thus, the greater part of the chip mounting area 3h on the surface 3a for flip-chip connection of the package substrate 3 is formed as the flat portion 3g, that is, there exists no obstacle to the flow of sealing resin 12, so that it is possible to diminish the formation of voids, and, hence, it is possible to improve the reliability of the stacked type package 10.

Also, in the case where wirings 3e are formed in the chip mounting area 3h of the surface 3a, if the pitch between adjacent wires is made sufficiently larger than, for example, the pitch between adjacent pads 1d (see FIG. 17) on the semiconductor chip 1, it is possible to diminish an obstacle to the flow of sealing resin 12 and, thereby, diminish the formation of voids.

That is, by widening the pitch between adjacent wires 3e on the wiring substrate sufficiently to such an extent as to not obstruct the flow of sealing resin 12, it is possible to diminish the formation of voids. Where it is difficult to sufficiently widen the pitch between adjacent wires 3e, the pitch may be made as narrow as possible in accordance with the wiring rule, allowing the formation of voids which are sufficiently small to not cause a defect.

Fourth Embodiment

Figure 26:
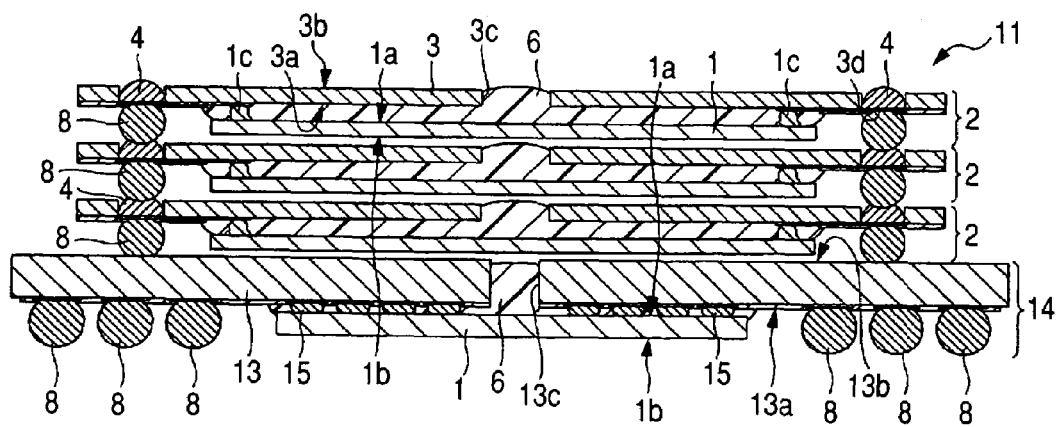
FIG. 26 is a sectional view showing a structural example of a semiconductor device according to a fourth embodiment of the present invention.

FIG. 26 is a sectional view showing a structural example of a semiconductor device according to a fourth embodiment of the present invention, and FIG. 27 is a manufacturing process flow chart showing an example of a procedure for assembling the semiconductor device illustrated in FIG. 26.

In connection with this fourth embodiment, a description will be given of a stacked type BGA (Ball Grid Array) 11. As a BGA substrate there is, for example, a multi-layer substrate (wiring substrate) 13 having a four-layer wiring structure; a second package 14 serving as a second semiconductor device structure is assembled using the multi-layer substrate 13; and first package structures 2 serving as constituent structures of the stacked type package 10, as described in connection with the third embodiment, are stacked in plural stages (three stages in this embodiment) on the second package structure 14. Thus, the semiconductor device of this fourth embodiment is a stacked type BGA 11 comprising a total of four layers of package structures.

A semiconductor chip 1 is flip-chip-connected also to the second package structure 14; and, in the under-fill resin sealing step after the flip-chip connection in the assembling work, a through hole 13c is formed nearly centrally of the semiconductor chip 1 on the multi-layer substrate 13 for injecting the sealing resin 12 (see FIG. 18) through the through hole 13c from a back surface 13b side opposite to a surface 13a (the flip-chip-connected side) of the multi-layer substrate 13.

In the second package structure 14, as shown in FIG. 26, plural solder balls 8 serving as external terminals are arranged in plural rows (three rows for example) outside and around the semiconductor chip 1 mounted by flip-chip connection. The solder balls 8 are provided on the same side as the side where the semiconductor chip 1 is mounted. That is, the second package structure 14 is a fan-out type package structure.

The semiconductor chip 1 incorporated in the second package structure 14 disposed in the bottom stage is a semiconductor chip having a logic circuit, for example, while the semiconductor chip 1 incorporated in each of the first package structures 2 stacked thereon is a semiconductor chip having a memory circuit for example.

Next, with reference to the manufacturing process flow chart of FIG. 27, a description will be given of a method for manufacturing the BGA 11 of this fourth embodiment.

Regarding how to assemble the first package structures 2 that are stacked on the second package structure 14, it is the same as that described in connection with the third embodiment, and, therefore, a tautological explanation thereof will be omitted.

First, there is provided a multi-layer substrate 13 formed as a wiring substrate having a through hole 13c which is nearly centrally of an area for mounting a semiconductor chip 1. On the other hand, there is a semiconductor chip 1 having pads 1d (see FIG. 17) serving as surface electrodes formed on a main surface 1a of the chip.

Subsequently, a chip mounting operation is carried out in step S11, as shown in FIG. 27. In this step, a surface 13a of the multi-layer substrate 13 and the main surface 1a of the semiconductor chip 1 are disposed in opposition to each other through solder bumps 15, and, then, in this state, the chip is flip-chip-connected to the substrate by reflow.

Thereafter, solder balls are supplied in step S12. In this step, plural solder balls 8 serving as external terminals are mounted outside and around the semiconductor chip 1 on the multi-layer substrate 13 by reflow.

In this case, the solder balls 8 are arranged on the same surface 13a as the chip-mounted surface of the multi-layer substrate 13 and are fixed by reflow. As a result, on the multi-layer substrate 13, the solder balls 8 are arranged on the same side as the mounted side of the semiconductor chip 1, whereby it is possible to reduce the thickness of the second package structure 14. For fixing the solder balls, a solder paste 4 is used, which is a Pb-free solder for example.

Then, in step S13, sealing is performed using an under-fill resin. In this step, also in the semiconductor device manufacturing method of this fourth embodiment, an under-fill sealing resin 12 (see FIG. 17) is dropwise injected into the through hole 13 from a back surface 13b side of the multi-layer substrate 13 and is fed between the semiconductor chip 1 and the multi-layer substrate 13.

In this way the sealing resin 12 is injected to nearly the central part of the semiconductor chip 1 from the back surface 13b side of the multi-layer substrate 13 and is fed between the chip and the substrate; whereby, as is the case with the third embodiment, the sealing resin 12 can be prevented from adhering to the solder balls 8 arranged outside the chip on the multi-layer substrate 13, and, hence, it is possible to improve the quality of the BGA 11.

Moreover, since the sealing resin 12 is injected from the back surface 13b side of the multi-layer substrate 13, the resin does not crawl up to the back surface 1b of the semiconductor chip 1, and it is possible to prevent projection of the chip 1 from the solder balls 8. As a result, it is possible to prevent the occurrence of any inconvenience at the time of packaging of the BGA 11.

Further, since the sealing resin 12 is injected from nearly the central part of the chip, the resin can be diffused outward from the central part of the chip; and, in comparison with the conventional method wherein the resin is injected sideways of the chip, it is possible to diminish the formation of voids caused by a roll-up phenomenon of the resin. Accordingly, it is possible to improve the reliability of the BGA 11.

The sealing step is followed by cutting the chip into individual pieces and sorting in step S14. In this step, second package structures 14 are formed by cutting into individual pieces, from which plural second package structures 14 of a good quality are obtained by sorting.

Thereafter, solder paste is supplied in step S15. In this step, for stacking and electrically connecting first package structures 2 onto each of the second package structures 14 formed above, a solder paste 4 is applied to predetermined terminals on the back surface 13b of the multi-layer substrate 13. As the solder paste 4, a Pb-free solder is used, for example.

Subsequently, stacking is performed in step S16. In this step, the second package structure 14 is disposed in the bottom stage and the first package structures 2 described in connection with the third embodiment are stacked thereon in plural stages (three stages in this embodiment).

More specifically, the first packages 2 are stacked in plural stages on the second package structure 14 while being aligned with one another.

Thereafter, an electric connection of solder balls 8 is effected between the first package structures 2.

In this way the assembly of the stacked type BGA 11 of this fourth embodiment shown in FIG. 4 is completed.

Fifth Embodiment

Figure 28:
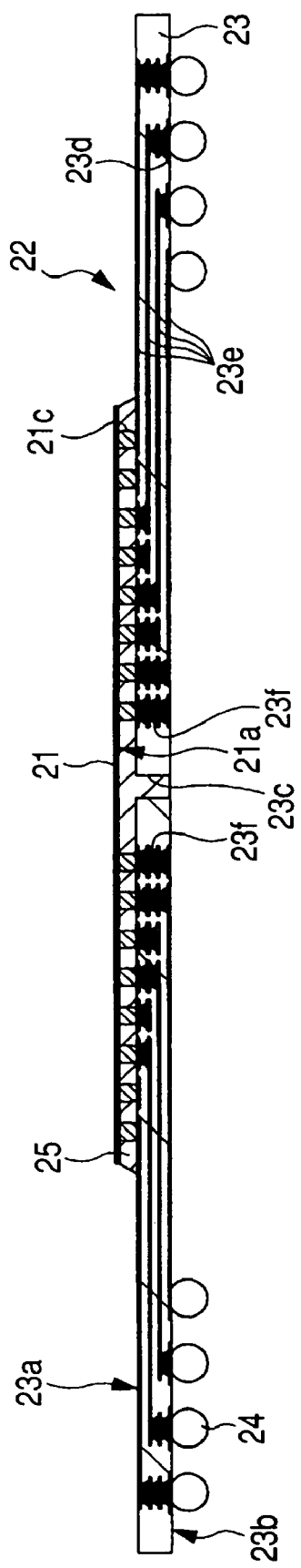
FIG. 28 is a sectional view showing a structural example of a semiconductor device according to a fifth embodiment of the present invention.
Figure 29:
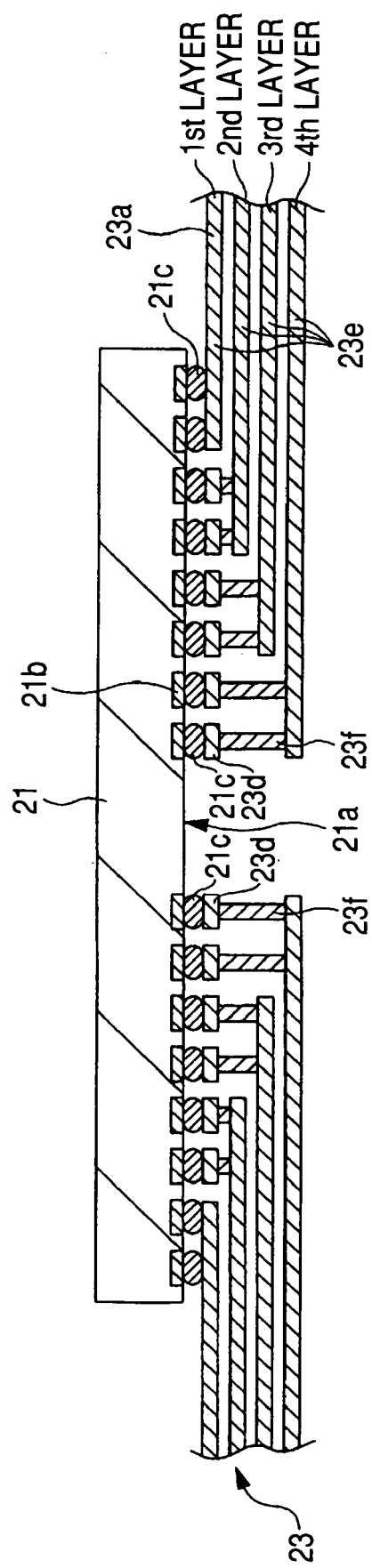
FIG. 29 is an enlarged partial sectional view showing an example of a state of connection between flip-chip connections and lead-out wires in the wiring layers of a multi-layer wiring substrate in the semiconductor device illustrated in FIG. 28.
Figure 30:
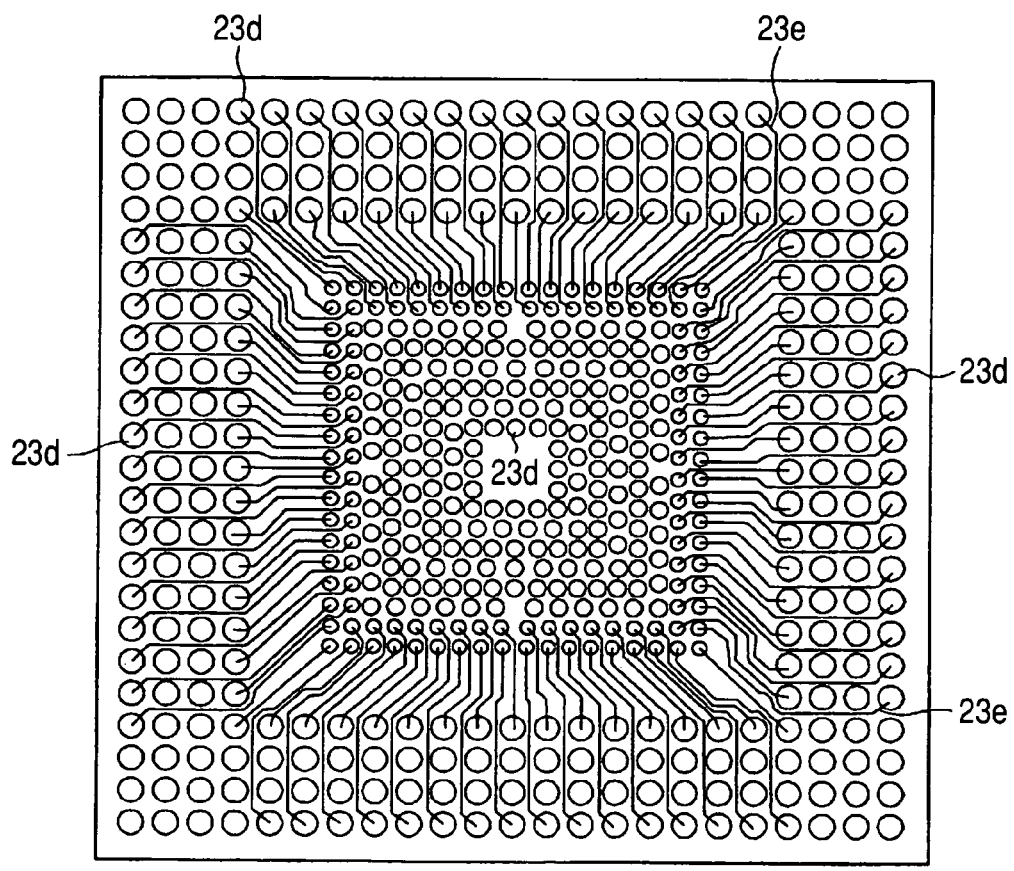
FIG. 30 is a plan view showing an example of the distribution of wires in a surface layer of the multi-layer wiring substrate incorporated in the semiconductor device illustrated in FIG. 28.
Figure 31:
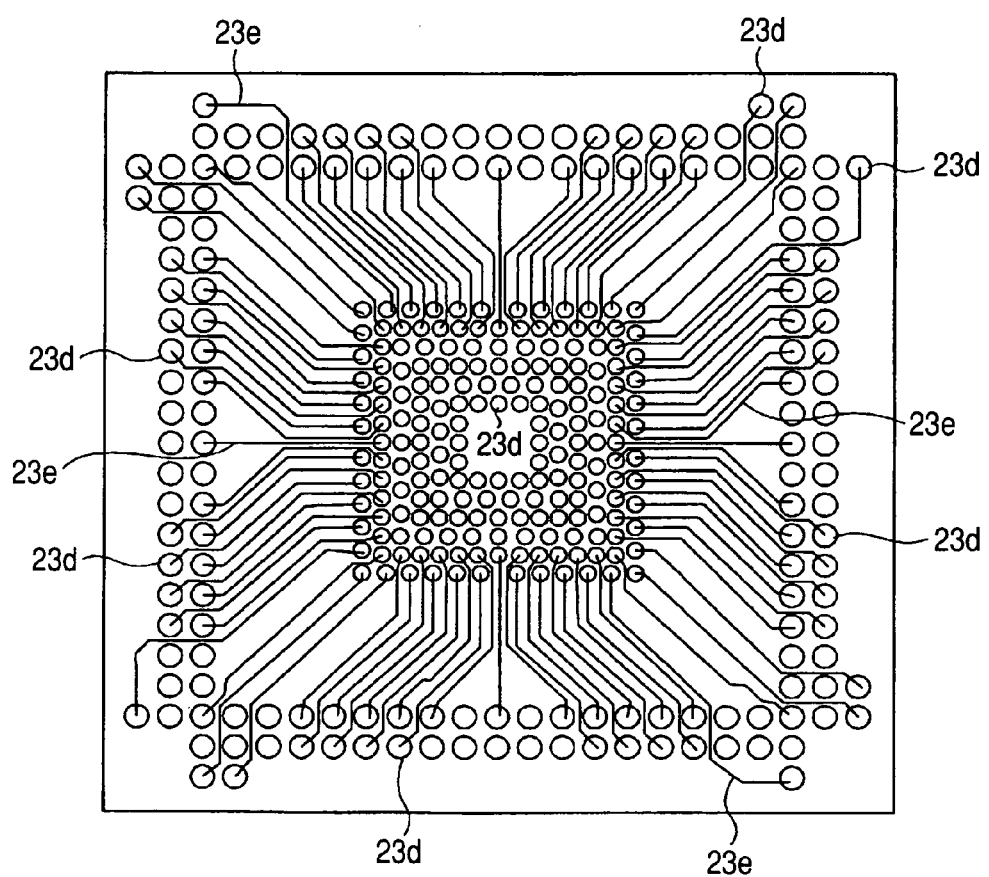
FIG. 31 is a plan view showing an example of the distribution of wires in a second layer of the multi-layer wiring substrate incorporated in the semiconductor device illustrated in FIG. 28.
Figure 32:
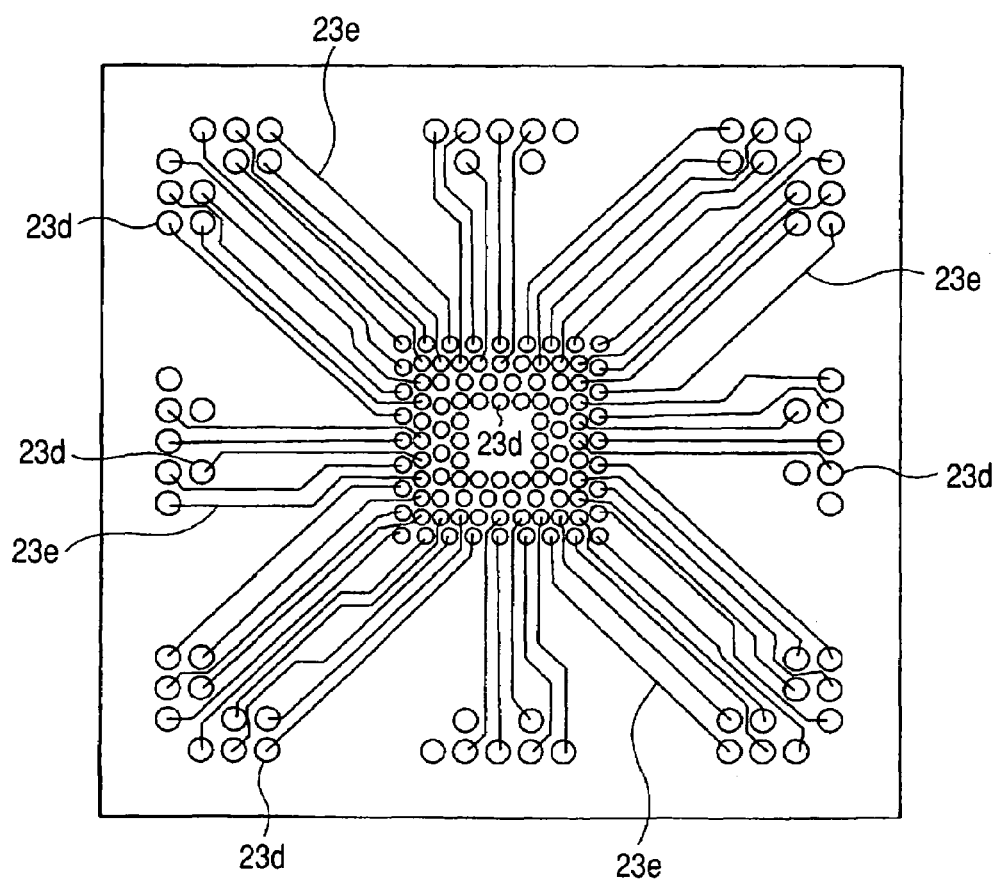
FIG. 32 is a plan view showing an example of the distribution of wires in a third layer of the multi-wiring substrate incorporated in the semiconductor device illustrated in FIG. 28.
Figure 33:
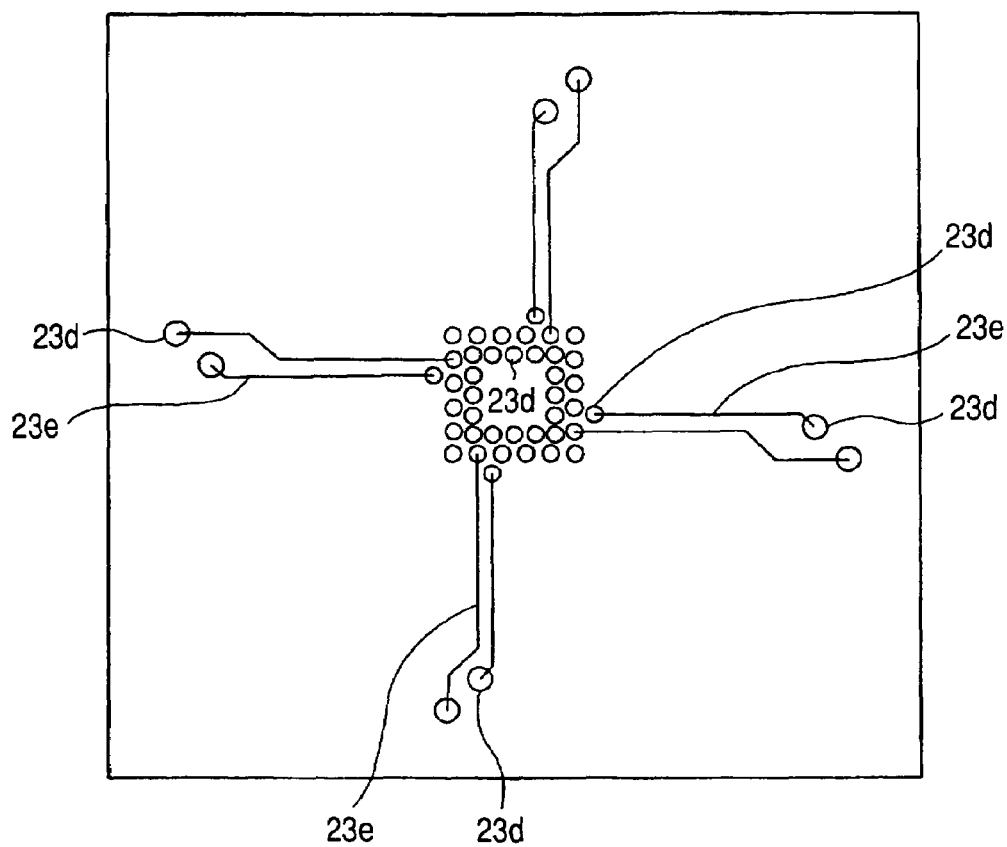
FIG. 33 is a plan view showing an example of the distribution of wires in a fourth layer of the multi-layer wiring substrate incorporated in the semiconductor device illustrated in FIG. 28.
Figure 34:
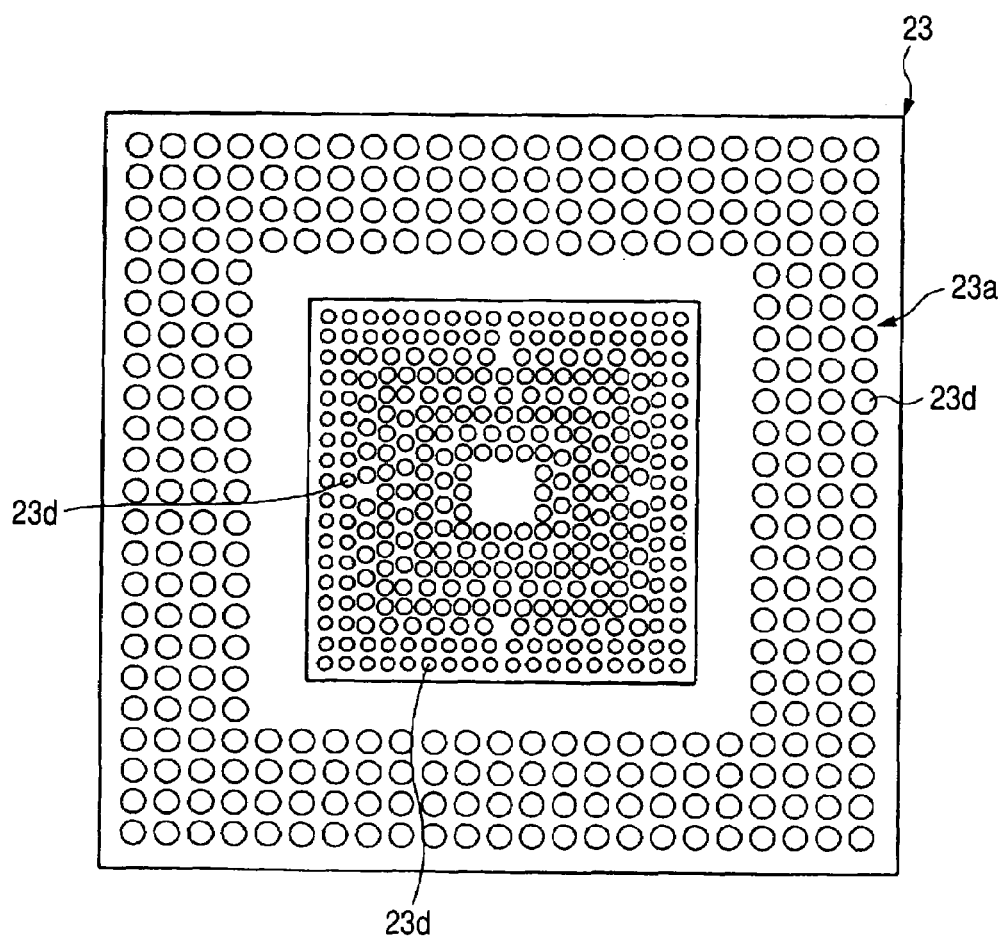
FIG. 34 is a plan view showing an example of a land array in the surface layer of the multi-layer wiring substrate incorporated in the semiconductor device illustrated in FIG. 28.
Figure 35:
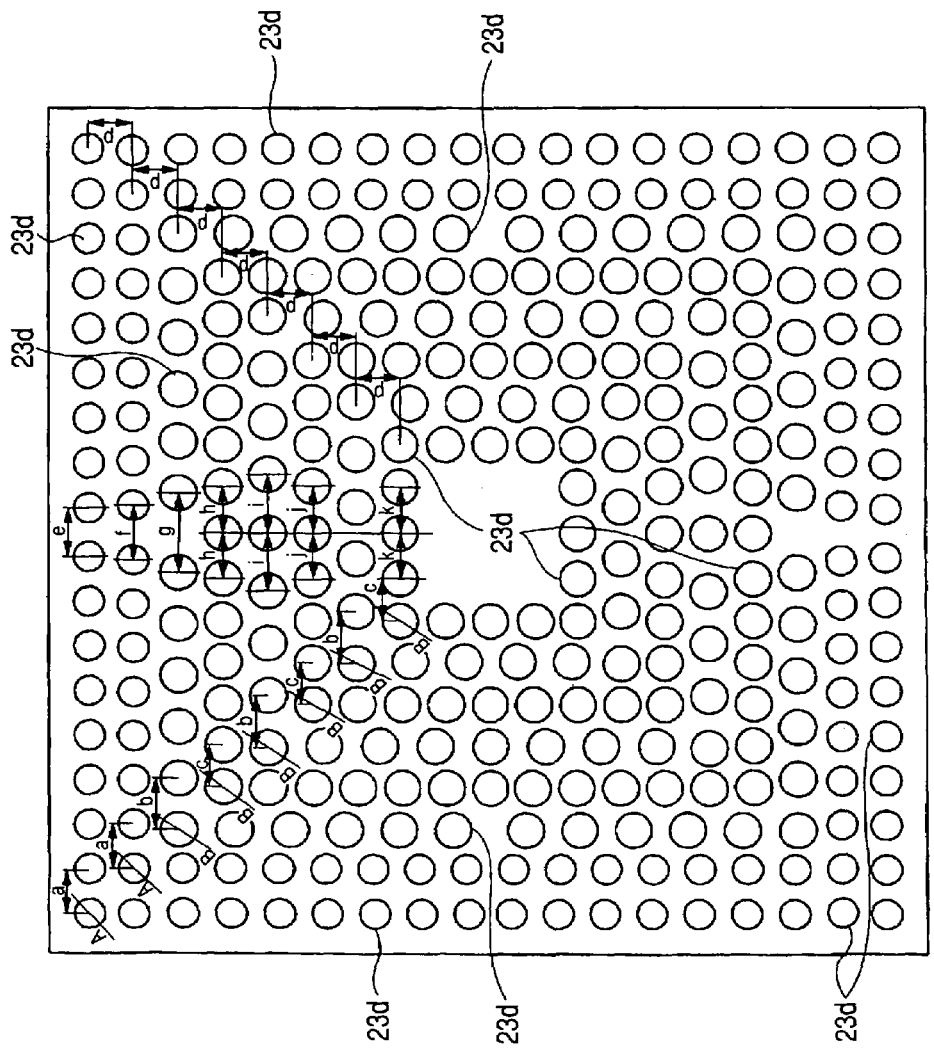
FIG. 35 is an enlarged plan view showing the details of a land array for flip-chip connection illustrated in FIG. 34.
Figure 36:
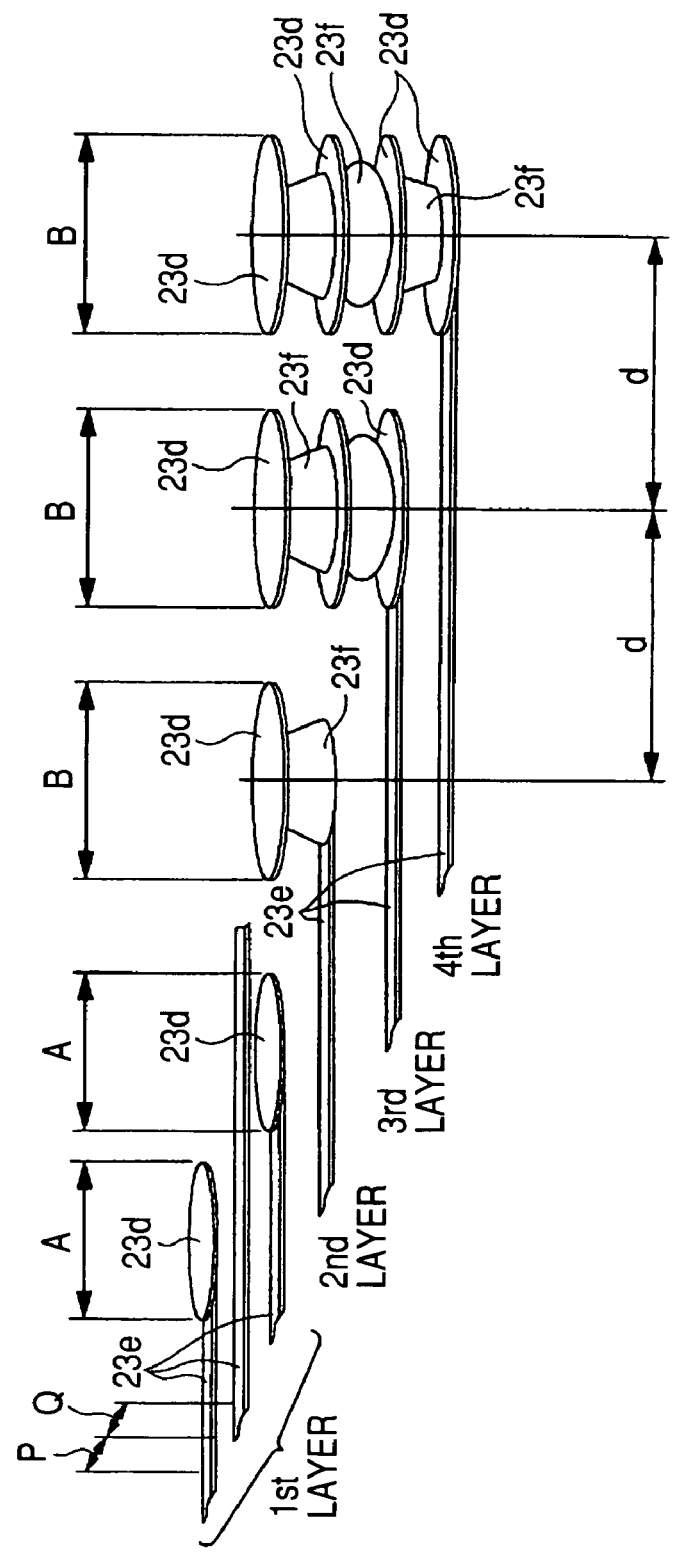
FIG. 36 is an enlarged partial perspective view showing the diameter of each land illustrated in FIG. 35 and also showing an example of a state of connection of the land with a via hole.
Figure 37:
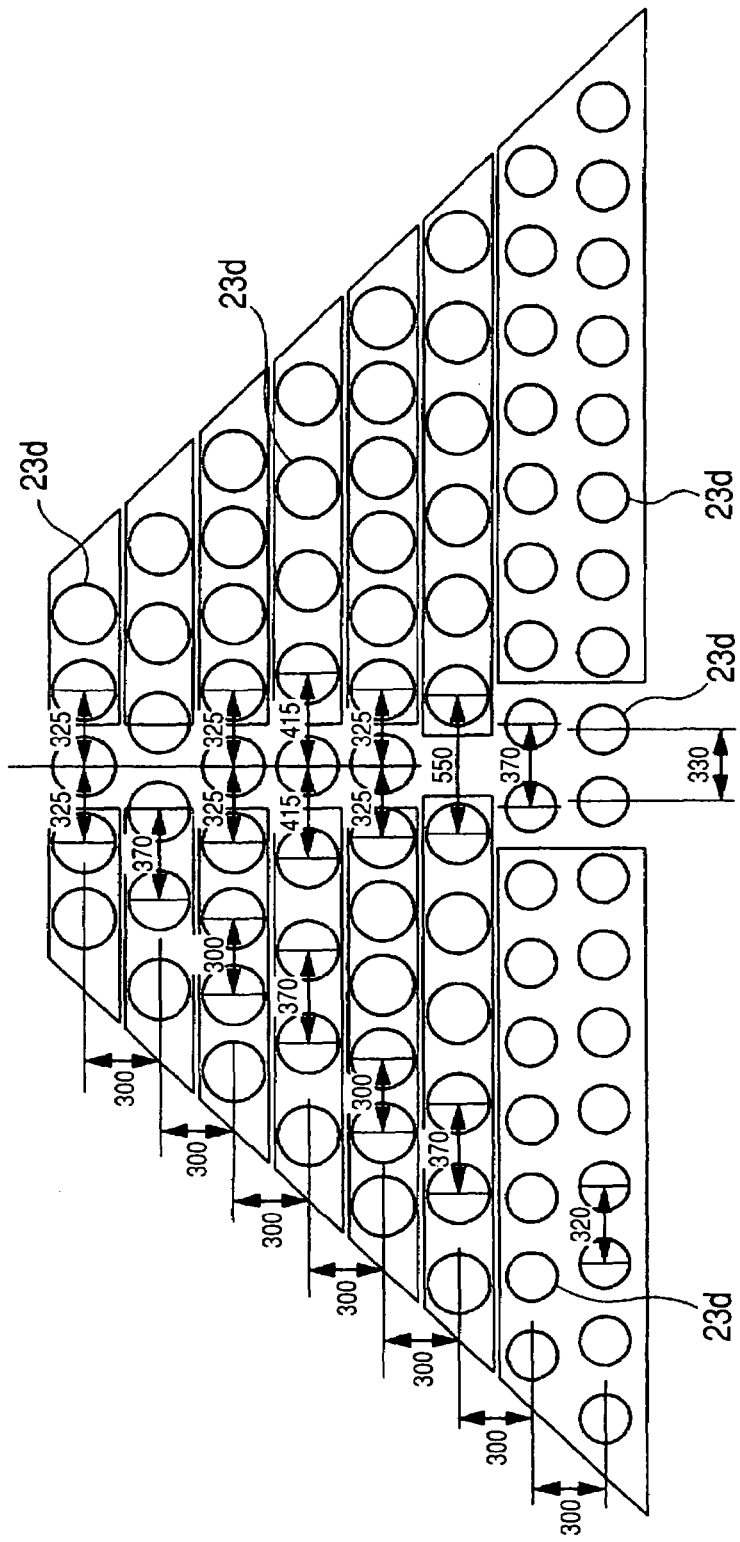
FIG. 37 is a partial plan view showing various examples of land pitches in the land array illustrated in FIG. 35.
Figure 38:
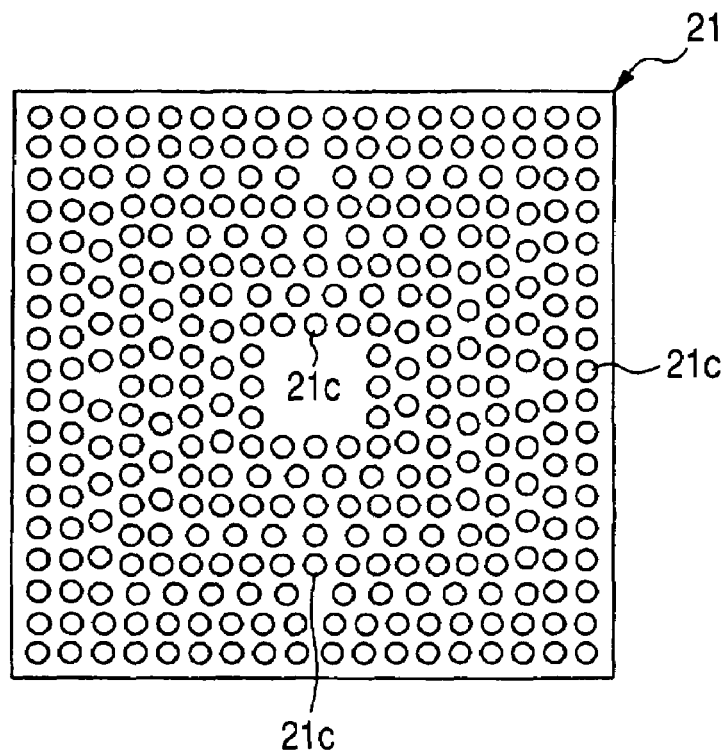
FIG. 38 is a plan view showing an example of a pad array on a main surface of a semiconductor chip incorporated in the semiconductor device illustrated in FIG. 28.
Figure 39:
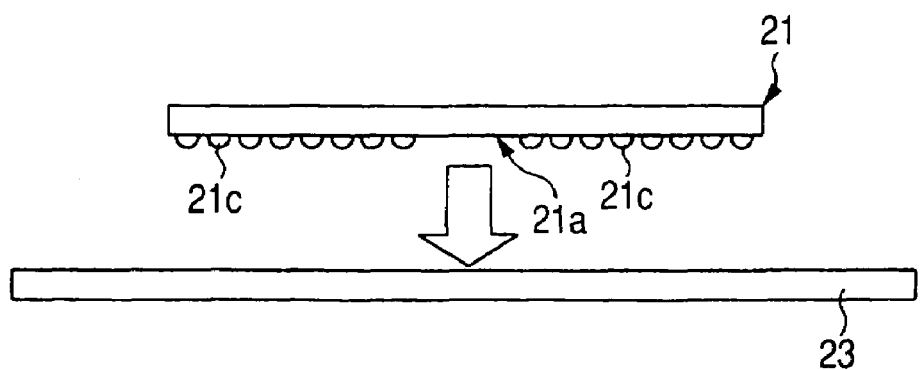
FIG. 39 is a side view showing an example of a method for effecting connection between the semiconductor chip illustrated in FIG. 38 and the multi-layer wiring substrate.
Figure 40:
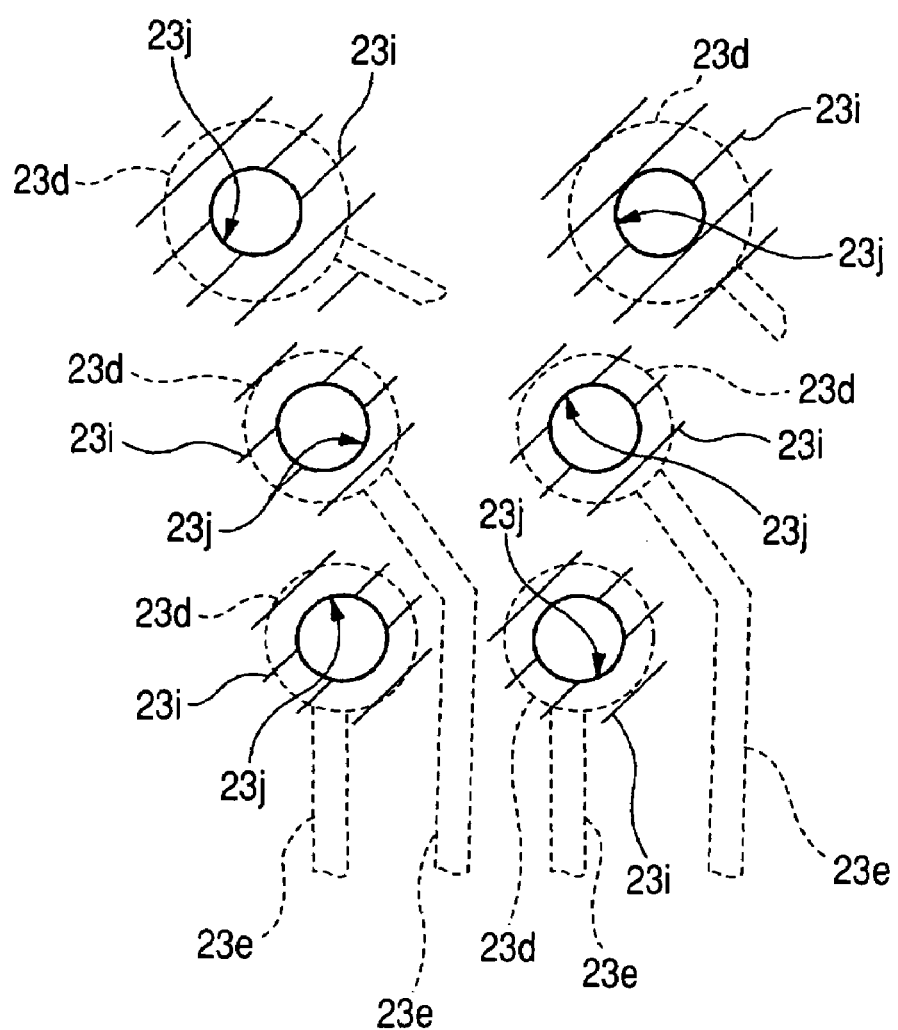
FIG. 40 is an enlarged partial plan view showing an example of an aperture shape in solder resist in the surface layer of the multi-layer wiring substrate used in the fifth embodiment.
Figure 41:
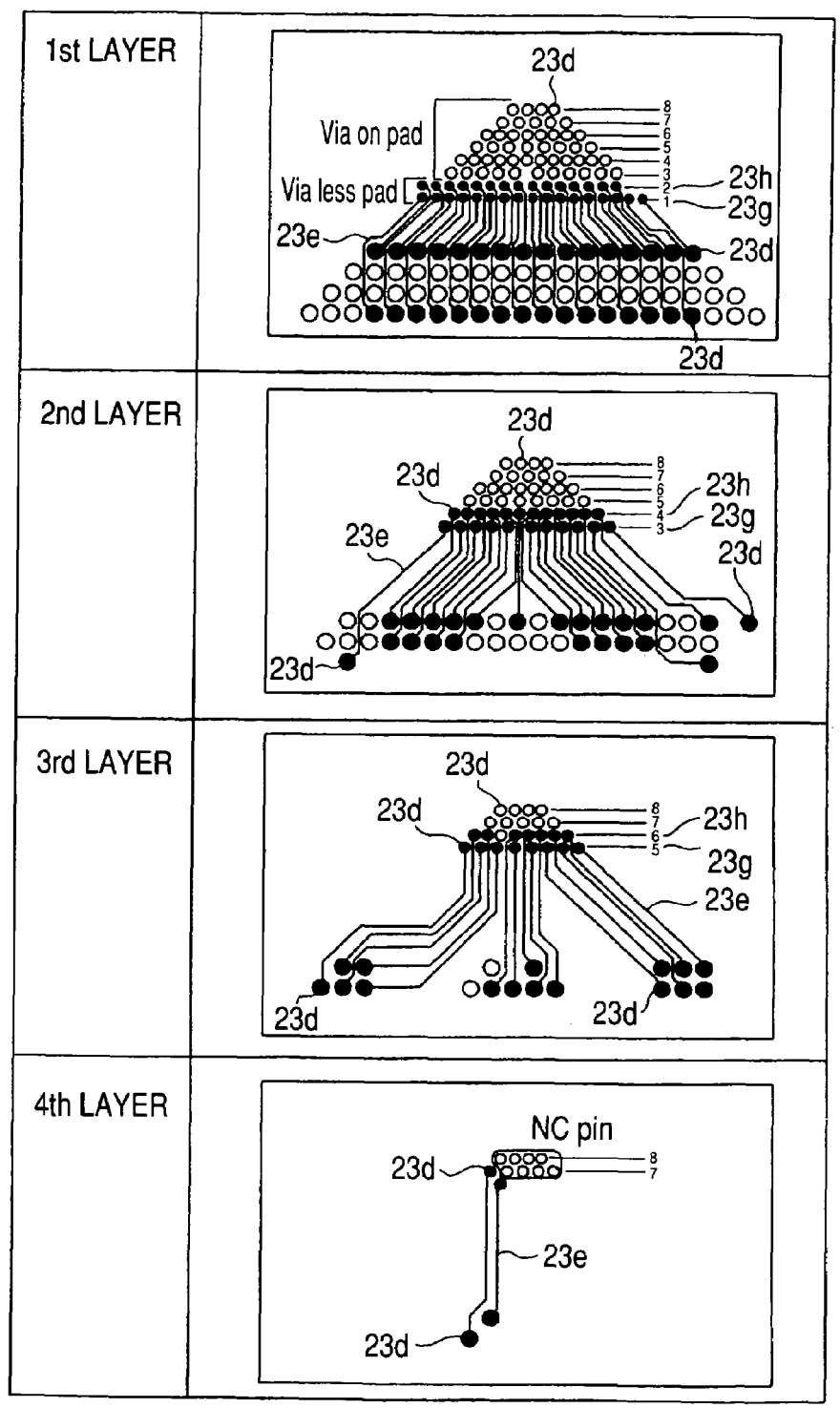
FIG. 41 is a diagram showing an example of a wire distribution rule in each wiring layer in the multi-layer wiring substrate illustrated in FIG. 34.
Figure 42:
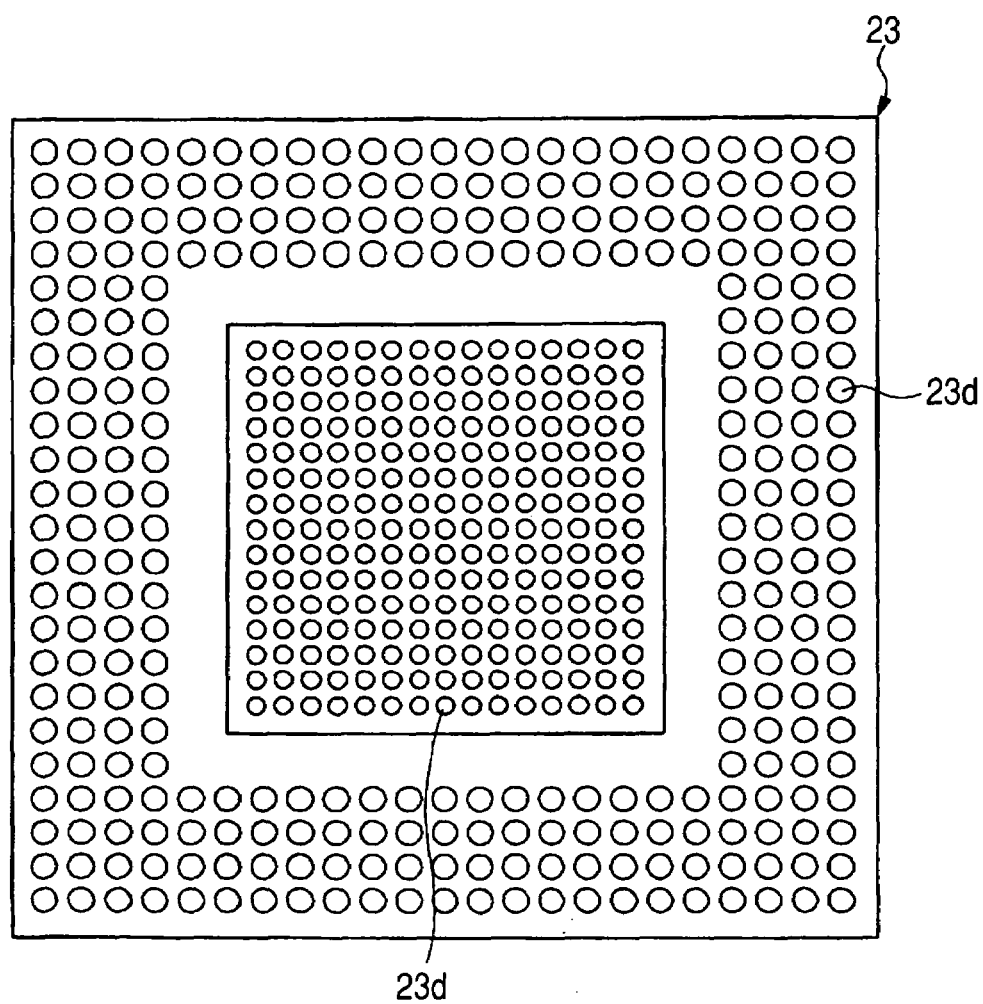
FIG. 42 is a plan view showing an example of a land array on a substrate as a comparative example compared with the multi-layer wiring substrate used in the fifth embodiment illustrated in FIG. 34.
Figure 43:
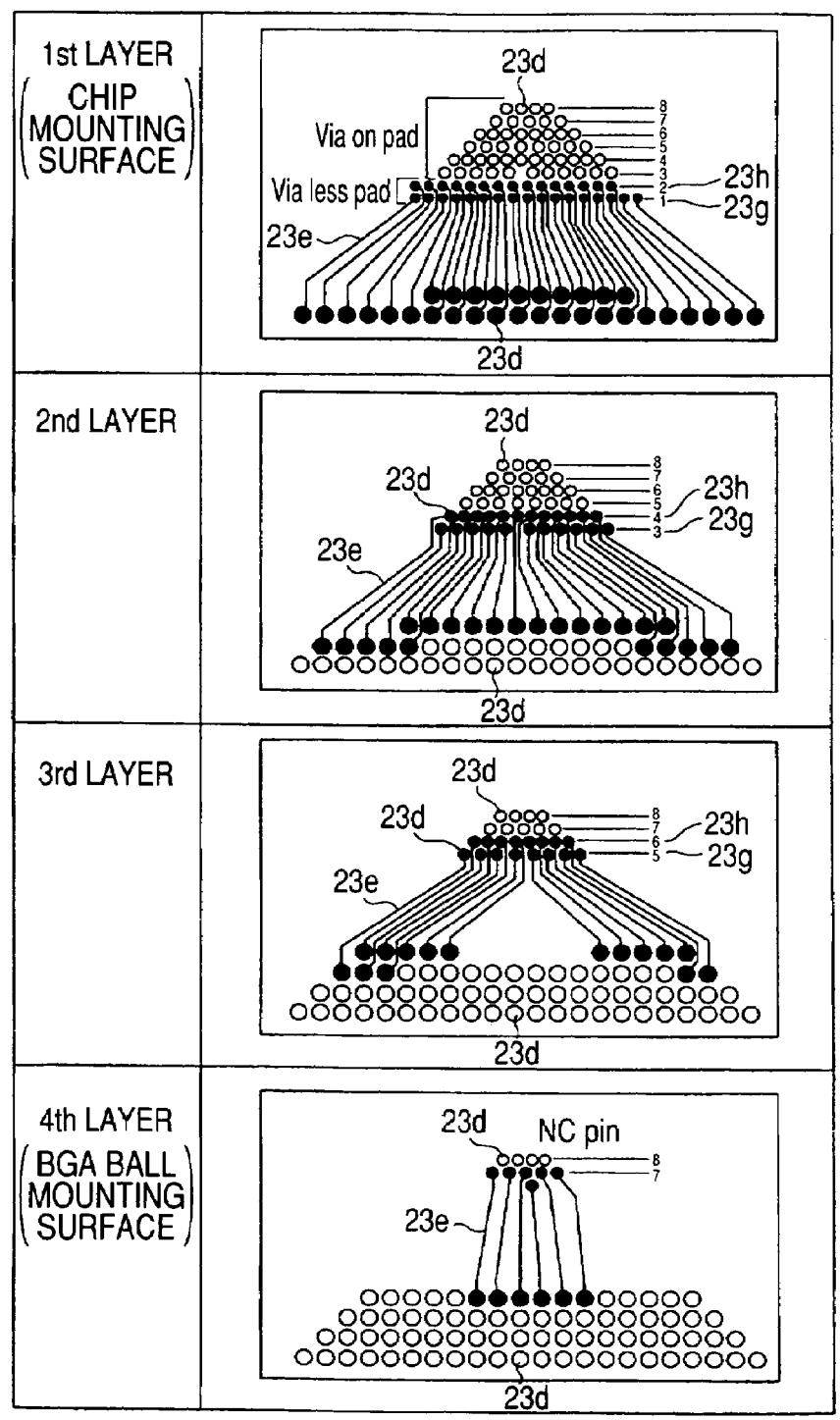
FIG. 43 is a diagram showing an example of a wire distribution rule in each wiring layer in a multi-layer wiring substrate incorporated in a fan-out type semiconductor device according to the fifth embodiment.
Figure 44:
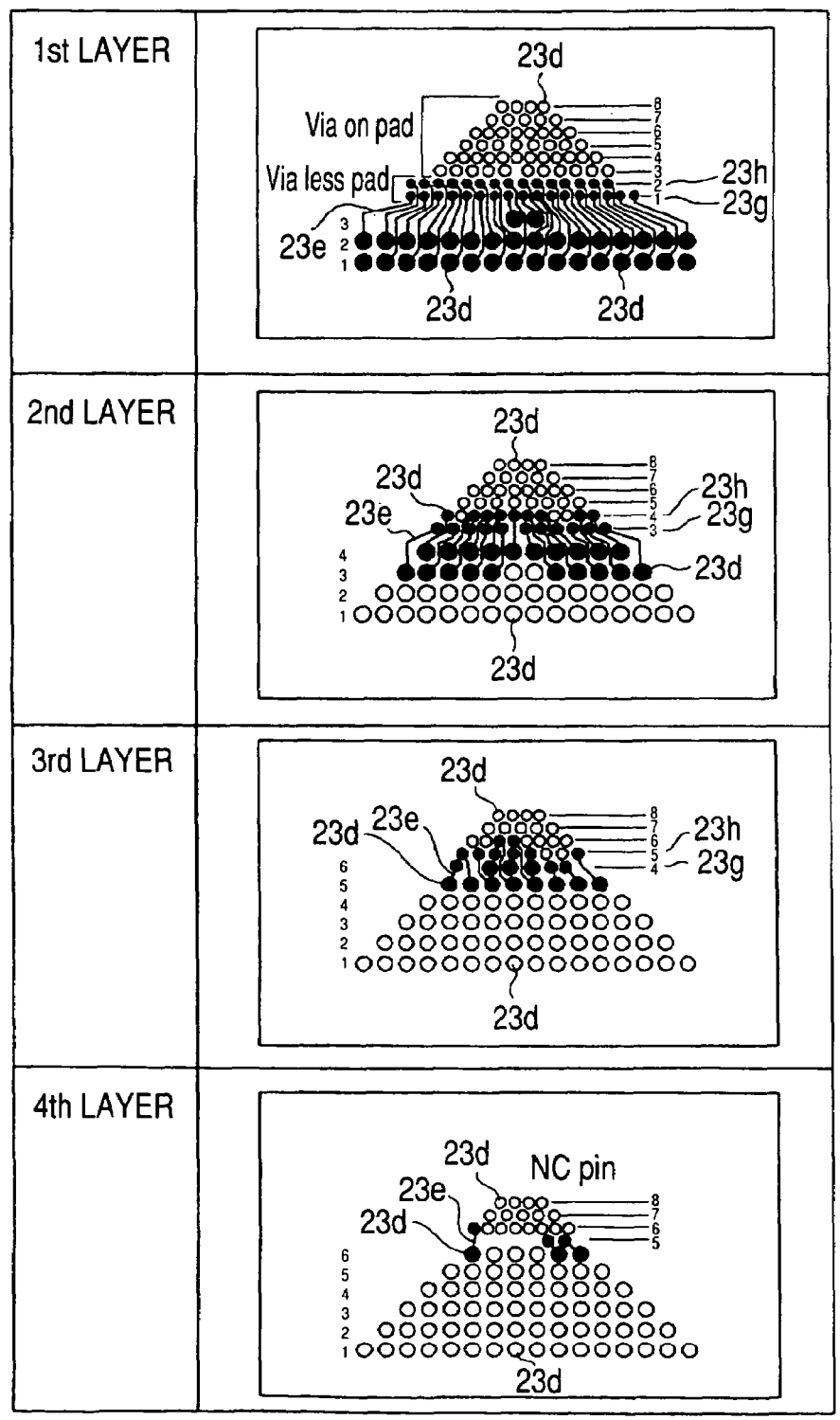
FIG. 44 is a diagram showing an example of a wire distribution rule in each wiring layer in a multi-layer wiring substrate incorporated in a fan-in/-out type semiconductor device according to the fifth embodiment.

FIG. 28 is a sectional view showing a structural example of a semiconductor device according to a fifth embodiment of the present invention; FIG. 29 is an enlarged partial sectional view showing an example of a state of connection between flip-chip connections and lead-out wires in the wiring layers of a multi-layer wiring substrate in the semiconductor device illustrated in FIG. 28; FIG. 30 is a plan view showing an example of the distribution of wires in a surface layer of the multi-layer wiring substrate incorporated in the semiconductor device illustrated in FIG. 28; FIG. 31 is a plan view showing an example of the distribution of wires in a second layer of the multi-layer wiring substrate incorporated in the semiconductor device illustrated in FIG. 28; FIG. 32 is a plan view showing an example of the distribution of wires in a third layer of the multi-wiring substrate incorporated in the semiconductor device illustrated in FIG. 28; FIG. 33 is a plan view showing an example of the distribution of wires in a fourth layer of the multi-layer wiring substrate incorporated in the semiconductor device illustrated in FIG. 28; FIG. 34 is a plan view showing an example of a land array in the surface layer of the multi-layer substrate incorporated in the semiconductor device illustrated in FIG. 28; FIG. 35 is an enlarged plan view showing the details of a land array for flip-chip connection illustrated in FIG. 34; FIG. 36 is an enlarged partial perspective view showing the diameter of each land illustrated in FIG. 35 and also showing an example of a state of connection of the land with a via hole; FIG. 37 is a partial plan view showing various examples of land pitches in the land array illustrated in FIG. 35; FIG. 38 is a plan view showing an example of a pad array on a main surface of a semiconductor chip incorporated in the semiconductor device illustrated in FIG. 28; FIG. 39 is a side view showing an example of a method for connection between the semiconductor chip illustrated in FIG. 38 and the multi-layer wiring substrate; FIG. 40 is an enlarged partial plan view showing an example of an aperture shape in solder resist in the surface layer of the multi-layer wiring substrate used in the fifth embodiment; FIG. 41 is a diagram showing an example of a wire distribution rule in each wiring layer in the multi-layer wiring substrate illustrated in FIG. 34; FIG. 42 is a plan view showing an example of a land array on a substrate serving as a comparative example compared with the multi-layer wiring substrate used in the fifth embodiment illustrated in FIG. 34; FIG. 43 is a diagram showing an example of a wire distribution rule in each wiring layer in a multi-layer wiring substrate incorporated in a fan-out type semiconductor device according to the fifth embodiment; and FIG. 44 is a diagram showing an example of a wire distribution rule in each wiring layer in a multi-layer wiring substrate incorporated in a fan-in/-out type semiconductor device according to the fifth embodiment.

The semiconductor device of this fifth embodiment, as illustrated in FIG. 28, is a BGA (Ball Grid Array) wherein a semiconductor chip 21 is flip-chip-connected to a multi-layer wiring substrate 23.

Such plural pads 21b as surface electrodes, as shown in FIG. 29, are formed in a lattice shape on a main surface 21a of the semiconductor chip 21, and gold bumps 21c serving as salient electrodes for flip-chip connection are formed on the pads 21b.

The semiconductor chip 21 mounted in the BGA 22 of this fifth embodiment is small-sized and has a relatively large number of pins. For example, it is a semiconductor chip having logic/ASIC.

The pads on the chip are arranged at narrow pitches. In a peripheral arrangement wherein the pads 21b are arranged in a peripheral area of the main surface 21a of the semiconductor chip 2, if the number of pins increases in addition to the narrowing of the pad pitch, a pad pitch which permits flip-chip connection encounters a limit and it becomes impossible to effect flip-chip connection. In view of this point, for permitting flip-chip connection, the pads on the chip are re-arranged from the peripheral arrangement into an array shape (lattice shape) as shown in FIG. 38 to provide a pad pitch which permits flip-chip connection.

Therefore, for achieving a reduction of the cost, the BGA 22 of this fifth embodiment adopts a multi-layer wiring substrate 23 fabricated by a subtractive method and has a structure wherein a semiconductor chip 21 is mounted onto the substrate by flip-chip connection. Thus, the multi-layer wiring substrate 23 having a highly efficient distribution of wires is incorporated in the BGA 22, taking conformity with the basic design rule of the subtractive method into account.

A description will now be given of the structure of the BGA 22 shown in FIG. 28. The BGA 22 comprises a multi-layer wiring substrate 23 having plural wiring layers each provided with plural lands 23d, a semiconductor chip 21 flip-chip-connected to lands 23d which are arranged in a lattice shape on a surface layer 23a of the multi-layer wiring substrate 23, plural gold bumps 21c serving as salient electrodes disposed between he multi-layer wiring substrate 23 and the semiconductor chip 21, plural solder balls 24 serving as external terminals connected electrically to the semiconductor chip 21 and provided in a ring shape on the multi-layer wiring substrate 23, and a sealing member 25 disposed between the multi-layer wiring substrate 23 and the semiconductor chip 21 and around the gold bumps 21c serving as flip-chip connections, the sealing member 25 being formed by an under-fill sealing method.

According to the under-fill sealing method, a sealing resin is injected from a back surface 23b side of the multi-layer wiring substrate 23 through a through hole 23c formed in the multi-layer wiring substrate 23, whereby the sealing member 25 is formed.

In the BGA 22, moreover, plural solder balls 24 serving as external terminals are arranged in plural rows and in a ring shape on the multi-layer wiring substrate 23 on the side opposite to the chip-mounted side. That is, plural solder balls 24 are provided on the back surface 23b of the multi-layer wiring substrate 23.

In this case, all the plural solder balls 8 are arranged outside and around the semiconductor chip 21. Such a BGA 22 is called a fan-out type BGA 22.

As shown in FIG. 30, the multi-layer wiring substrate 23 is provided in each of its wiring layers with lead-out wires 23e for electric connection between lands 23d for flip-chip connection and lands 23d for solder ball connection. Further, as shown in FIG. 41, the multi-layer wiring substrate 23 is provided in any of its plural wiring layers with a first land row 23g for passing the lead-out wires 23e between adjacent lands 23d for flip-chip connection and a second land row 23h not passing the lead-out wires 23e between the lands 23d for flip-chip connection. The first and second land rows 23g, 23h are formed such that the pitch between adjacent lands 23d in the first land row 23g is larger than the pitch between adjacent lands 23d in the second land row 23h (e.g., pitch b>pitch c in FIG. 35).

That is, the plural lands 23d for flip-chip connection formed on the surface layer 23a of the multi-layer wiring substrate 23 which is incorporated in the BGA 22 of this fifth embodiment are arranged at different pitches as shown in FIG. 35.

Further, in connection with the plural lands 23d for flip-chip connection arranged on the surface layer 23a of the multi-layer wiring substrate 23, the diameter (B) of each of the lands 23d which are connected through via holes 23f to lead-out wires 23e in inner layers (second, third and fourth layers) as in FIG. 36 is larger than the diameter (A) of each of lands 23d which are directly connected to lead-out wires 23e arranged on the surface layer 23a (first layer).

For example, (B)=250 μm, (A)=200 μm, both being in a relation of (B)>(A).

The pitch (d) between adjacent via holes 23f for connection to the lead-out wires 23e in each inner layer is, for example, (d)=300 μm. Further, a line width (P) of each of the lead-out wires 23e that are arranged on the surface layer 23a and the space (Q) between adjacent wires 23e are, for example, (P)=40 μm and (Q)=40 μm.

Thus, the plural lands 23d for flip-chip connection formed on the surface layer 23a of the multi-layer wiring substrate 23 in this fifth embodiment are arranged at plural different pitches and have plural diameters.

The following description is now provided to indicate in what manner wires are drawn out from the lands 23d for flip-chip connection in each wiring layer in the multi-layer wiring substrate 23 shown in FIGS. 29 to 33 up to the lands 23d for solder ball connection.

In such a multi-layer wiring substrate 23 having four wiring layers, as shown in FIG. 29, it is preferable that the connection between the latticewise arranged lands 23d for flip-chip connection in the surface layer 23a of the multi-layer wiring substrate 23 and the lead-out wires 23e in each wiring layer be made at every two rows of the latticewise arranged lands 23d for flip-chip connection.

That is, as shown in FIG. 30, in the first layer (surface layer 23a), the lands 23d located in two outer rows of the latticewise arranged lands 23d for flip-chip connection and lead-out wires 23e are connected together, then the lead-out wires 23e are connected to predetermined lands 23d for solder ball connection.

Subsequently, in the second layer, as shown in FIG. 31, the lands 23d located in the third and fourth rows from the outside, of the latticewise arranged lands 23d for flip-chip connection and lead-out wires 23e are connected together, then the lead-out wires 23e are connected to predetermined lands 23d for solder ball connection.

Further, in the third layer, as shown in FIG. 32, the lands 23d located in the fifth and sixth rows from the outside, of the latticewise arranged lands 23d for flip-chip connection, and lead-out wires 23e are connected together, then the lead-out wires 23e are connected to predetermined lands for solder ball connection.

Lastly, in the fourth layer, as shown in FIG. 33, a part of lands 23d located in two inner rows, of the latticewise arranged lands 23d for flip-chip connection, and lead-out wires 23e are connected together, then the lead-out wires 23e are connected to lands 23d for solder ball connection.

In each wiring layer, however, non-contact lands 23d not connected to lead-out wires 23e are included in the lands 23d for solder ball connection.

Thus, in the multi-layer wiring substrate 23, the connection between the latticewise arranged lands 23d for flip-chip connection and the lead-out wires 23e in each wiring layer is performed in plural rows, for example, two rows, at a time of the latticewise arranged lands 23d for flip-chip connection in accordance with the number of wiring layers, whereby the wires can be distributed efficiently.

Next, the following description is provided concerning land pitch, land diameter, and the distribution of wires, taking into account conformity with the substrate design rule in case of adopting the multi-layer wiring substrate 23 fabricated by the subtractive method.

FIG. 34 shows an array of lands 23d for clip-chip connection and lands 23d for solder ball connection in the surface layer 23a of the multi-layer wiring substrate 23 and FIG. 35 shows an array of only the lands 23d for flip-chip connection on a larger scale. Solder balls 24 are connected to the lands 23d for solder ball connection on the back surface 23b of the substrate.

In the BGA 22 of this fifth embodiment, as shown in FIG. 35, the number of lands 23d for flip-chip connection on the multi-layer wiring substrate 23 is set to a maximum number taking into account conformity with the substrate design rule in case of adopting the multi-layer wiring substrate 23 fabricated by the subtractive method.

That is, plural land diameters and plural land-to-land pitch are set.

First, as to land diameters, as shown in FIG. 36, there are two land diameters, one of which is of lands 23d connected through via holes 23f to lead-out wires 23e in the inner layers (second, third and fourth layers) and the other of which is of lands 23d connected directly to lead-out wires 23e disposed on the surface layer 23a (first layer). The diameter (B) of each of lands 23d connected to the inner layer lead-out wires 23e through via holes 23f is larger than the diameter (A) of lands 23d connected directly to the lead-out wires 23e on the surface layer 23a. For example, (B)=250 μm, (A)=200 μm, and (B)>(A).

The lands 23d of the smaller diameter connected directly to the lead-out wires 23e on the surface layer 23a are arranged outside in two rows, of the latticewise arranged lands 23d for flip-chip connection. That is, as shown in FIG. 35, in the lattice-like lands 23d for flip-chip connection, all of the outer two rows comprise the lands 23d of the smaller diameter.

As to land-to-land pitches, in the example shown in FIG. 35, there are a total of eight pitches at eleven positions of (a), (b), (c), (d), (e), (f), (g), (h), (i), (j) and (k), including vertical and lateral pitches in the figure. In the two rows connected in each wiring layer, the outer row comprises lands 23d arranged at a pitch (b) which permits passage of one wire, while the inner row comprises lands 23d capable of being arranged at a minimum pitch (c). Thus, the lands of the inner row are arranged at a narrower pitch than the lands of the outer row.

Since the diameter (B) of each of lands 23d connected to the lead-out wires 23e in the inner layers is larger than the diameter (A) of lands 23d connected directly to the lead-out wires 23e on the surface layer 23a, the lands in the outer two rows (a) can be arranged at a narrower pitch than the lands in the inner rows (b).

Further, the spacing between adjacent rows can be set at a minimum pitch (d) which permits arrangement of lands 23d.

In this way the pitches (a), (b), (d) and (d) are determined. Further, nearly centrally of the land rows, lands 23d are arranged so that their positions lie on a center line or are symmetric with respect to the center line to determine the pitches (e), (f), (g), (h), (i), (j) and (k).

For example, in the case of a semiconductor chip 21 having a size of 6 mm×6 mm, as shown in FIG. 37, (a)=320 μm, (b)=370 μm, (c)=300 μm, (d)=300 μm, (e)=330 μm, (f)=370 μm, (g)=550 μm, (h)=325 μm, (i)=415 μm, (j)=325 μm, and (k)=325 μm.

Thus, even in case of adopting a multi-layer wiring substrate 23 of a low cost that is fabricated by the subtractive method, the number of lands 23d for flip-chip connection can be increased taking conformity with the substrate design rule into account.

As a result of an increase in the number of lands 23d for flip-chip connection, not only does it become possible to effect a higher density packaging also for a BGA 22 of a small chip or multiple pins, but also it is possible to improve the electrical characteristics of the BGA 22.

Moreover, since the multi-layer wiring substrate 23 fabricated by the subtractive method can be used also in flip-chip connection, it is possible to attain a reduction in the cost of the BGA 22 in which the semiconductor chip 21 having latticewise arranged gold bumps 21c is flip-chip-connected to the multi-layer wiring substrate 23, as shown in FIGS. 38 and 39.

Further, since the number of lands 23d for flip-chip connection can be increased, it becomes possible to increase the number of effective pins, and, hence, it is possible to improve the performance of the BGA 22.

By arranging lands 23 at different land diameters and land-to-land pitches, as in the land array for flip-chip connection shown in FIG. 35, it is possible to arrange 320 lands 23d for flip-chip connection.

On the other hand, in the case where lands 23d are arranged at one land diameter and one land-to-land pitch on the chip of the same size as in a comparative example shown in FIG. 42, the number of lands 23d capable of being arranged is 225. That is, in the BGA 22 of the first embodiment, the number of lands capable of being arranged can be increased by 95 as compared with the comparative example.

Thus, it is possible to increase the number of effective pins for flip-chip connection.

In the multi-layer wiring substrate 23, as shown in FIGS. 36 and 40, the lands 3d connected to lead-out wires 23e in each inner layer through via holes 23f and the lands connected directly to lead-out wires 23e arranged on the surface layer 23a are each covered with solder resist 23i having circular apertures 23j of the same size, the apertures 23j being positioned on the lands 23d, respectively.

That is, the lands 23d connected to lead-out wires 23e in each inner layer through via holes 23f and the lands 23d connected directly to lead-out wires 23e arranged on the surface layer 23a are different in diameter, but the exposed terminal portions for flip-chip connection defined by the apertures 23j of the solder resist 23i are circular portions of the same size.

Therefore, even if the lands 23d are different in size, the flip-chip connections by gold bumps 21c can be stabilized in connecting strength and it is possible to prevent the occurrence of a defective connection in the gold bumps 21c.

Next, a description will be given below concerning the distribution of wires for the lands 23d for flip-chip connection and the lands 23d for solder ball connection in each wiring layer in the multi-layer wiring substrate 23 of the BGA 22 shown in FIG. 41.

FIG. 41 shows the distribution of wires in only a one-fourth range of the substrate main surface in each wiring layer in the multi-layer wiring substrate 23, but in the multi-layer wiring substrate of BGA 22, the illustrated distribution of wires covers the whole range of the substrate main surface.

First, in the first wiring layer (surface layer 23a), of latticewise arranged lands 23d for flip-chip connection, the lands 23d in the first land row 23g located at an outermost periphery position and the lands 23d in the second row (second land row 23h) from the outermost periphery are drawn out by lead-out wires 23e and are connected to lands 23d for solder ball connection located in one innermost periphery row and the row located outside the innermost row.

In this case, since the lands 23d for flip-chip connection located in the two outermost periphery rows are for direct connection to lead-out wires 23e without going through via holes 23f, the land diameter is set small and the land-to-land pitch is set to a minimum narrow pitch. However, one wire is disposed between adjacent lands in the first land row 23g located at the outermost periphery position. The lands 23d for flip-chip connection in the third and subsequent rows from the outermost periphery are connected to the next layer through via holes 23f and in this case the land diameter is larger than that in the outermost two rows because of connection to via holes 23f.

Subsequently, in the second wiring layer, the lands 23d for flip-chip connection in the third and fourth rows from the outermost periphery are drawn out and connected to predetermined lands 23d for solder ball connection.

The lands in the third row (first land row 23g) are arranged at a pitch which permits one wire to be disposed between adjacent lands. The lands in the fourth row (second land row 23h) are arranged in only a minimum space because it is not necessary to pass a wire between adjacent lands. Thus, there exists a relation of the land-to-land pitch in the third row (first land row 23g)>the land-to-land pitch in the fourth row (second land row 23h).

Next, in the third wiring layer, the lands in the fifth and sixth rows are drawn out.

The lands in the fifth row (first land row 23g) are arranged at a pitch which permits one wire to be disposed between adjacent lands. In the sixth row (second land row 23h), the lands are arranged in a minimum space because it is not necessary to pass a wire between adjacent lands. Thus, there exists a relation of the land-to-land pitch in the fifth row (first land row 23g)>the land-to-land pitch in the sixth row (second land row 23h).

Subsequently, in the fourth wiring layer, the lands in the seventh and eighth rows are drawn out from the outermost periphery.

The lands in the seventh row are arranged at a pitch which permits one wire to be disposed between adjacent lands. The lands in the eighth row are arranged in only a minimum space because it is not necessary to pass a wire between adjacent lands. Thus, there exists a relation of the land-to-land pitch in the seventh row>the land-to-land pitch in the eighth row.

In this way, in each wiring layer, the lands 23d for flip-chip connection and the lands 23d for solder ball connection are drawn out and connected through lead-out wires 23e.

Next, a modification of the fifth embodiment of the invention will be described.

FIGS. 43 and 44 show a method for distribution of wires in a fan-out type semiconductor device and that in a fan-in/-out type semiconductor device, respectively.

The fan-out type semiconductor device has a structure wherein all of plural external terminals are arranged outside and around the semiconductor chip 21, while the fan-in/-out type semiconductor device has a structure wherein on a substrate back surface a plurality of external terminals are arranged so as to span both inner and outer areas of the semiconductor chip 21.

FIGS. 43 and 44 show the distribution of wires between lands 23d for flip-chip connection and lands 23d for solder ball connection in each wiring layer in a multi-layer wiring substrate 23, in a fan-out type semiconductor device and a fan-in/-out type semiconductor device, respectively.

Also, in each wiring layer in the multi-layer wiring substrate shown in each of FIGS. 43 and 44, the distribution of wires is shown in only a one-fourth range of a substrate main surface, but in the multi-layer wiring substrate 23 of each semiconductor device, the illustrated distribution of wires covers the whole range of the substrate main surface.

Reference will first be made to the distribution of wires in the fan-out type semiconductor device shown in FIG. 43. In the first wiring layer (surface layer 23a), of the latticewise arranged lands 23d for flip-chip connection, the lands 23d in the first land row 23g located at the outermost periphery position and the lands 23d in the second row (second land row 23h) from the outermost periphery are drawn out by lead-out wires 23e and are connected to predetermined lands 23d for solder ball connection located at the outermost periphery.

In this case, since the lands 23d for flip-chip connection in the two outermost periphery rows are lands connected directly to lead-out wires 23e without going through via holes 23f, the land diameter is set small and the land-to-land pitch is set to a minimum narrow pitch. However, one wire is disposed between adjacent lands in the first outermost row 23g. The lands 23d for flip-chip connection in the third and subsequent rows from the outermost row are connected to the next layer through via holes 23f. In this case, the land diameter is larger than that in the two outermost rows because of connection to via holes 23f.

Subsequently, in the second wiring layer, the lands for flip-chip connection in the third and fourth rows from the outermost periphery are drawn out and connected to lands for solder ball connection in the second and third rows from the outermost periphery. The lands for flip-chip connection in the third row (first land row 23g) are arranged at a pitch which permits one wire to be disposed between adjacent lands. The lands in the fourth row (second row 23h) are arranged in a minimum space because it is not necessary to pass a wire between adjacent lands. Thus, there exists a relation of the land-to-land pitch in the third row (first land row 23*g*)>the land-to-land pitch in the fourth row (second land row 23*h*).

Then, in the third wiring layer, the lands for flip-chip connection in the fifth and sixth rows from the outermost periphery are drawn out and connected to lands for solder ball connection in the third and fourth rows from the outermost periphery. The lands for flip-chip connection in the fifth row (first land row 23*g*) are arranged at a pitch which permits one wire to be disposed between adjacent lands. The lands in the sixth row (second land row 23*h*) are arranged in only a minimum space because it is not necessary to pass a wire between adjacent lands. Thus, there exists a relation of the land-to-land pitch in the fifth row (first land row 23*g*)>the land-to-land pitch in the sixth row (second land row 23*h*).

Subsequently, the lands for flip-chip connection in the seventh and eighth rows are drawn out and connected to lands for solder ball connection in the fourth row from the outermost periphery. The lands in the seventh row for flip-chip connection are arranged at a pitch which permits one wire to be disposed between adjacent lands. Further, the lands in the eighth row are arranged in only a minimum space because it is not necessary to pass a wire between adjacent lands. Thus, there exists a relation of the land-to-land pitch in the seventh row>the land-to-land pitch in the eighth row.

In this way, in each wiring layer, the lands 23*d* for flip-chip connection and the lands 23*d* for solder ball connection are connected through lead-out wires 23*e* to complete distribution of wires in the fan-out type semiconductor device.

Next, a description will be given about distribution of wires in the fan-in/-out type semiconductor device shown in FIG. 44. In the first wiring layer (surface layer 23*a*), of the latticewise arranged lands 23*d* for flip-chip connection, the lands 23*d* in the first land row 23*g* located at the outermost periphery position and the lands 23*d* in the second row (second land row 23*h*) from the outermost periphery are drawn out by lead-out wires 23*e* and are connected to predetermined lands 23*d* for solder ball connection in the first, second and third outermost rows.

In this case, as to the lands 23*d* for flip-chip connection in the two outermost rows, since they are lands connected directly to lead-out wires 23*e* without going through via holes 23*f*, the land diameter is set small and the land-to-land pitch is set to a minimum narrow pitch. However, one wire is disposed between adjacent lands in the first outermost land row 23*g*. The lands 23*d* for flip-chip connection in the third and subsequent rows from the outermost periphery are connected to the next layer through via holes 23*f*. In this case, the land diameter is larger than that in the two outermost rows because of connection to via holes 23*f*.

Subsequently, in the second wiring layer, the lands for flip-chip connection in the third and fourth rows from the outermost periphery are drawn out and connected to lands for solder ball connection in the third and fourth rows from the outermost periphery. In this case, the lands 23*d* for solder ball connection in the fourth and subsequent rows are disposed below the chip to afford a fan-in layout, but it is possible to make a fan-in layout of solder balls 24 because flip-chip connection is effected in the first layer.

Also, in this case, the lands for flip-chip connection in the third row (first land row 23*g*) are arranged at a pitch which permits one wire to be disposed between adjacent lands. The lands in the fourth row (second land row 23*h*) are arranged in only a minimum space because it is not necessary to pass a wire between adjacent lands. Thus, there exists a relation of the land-to-land pitch in the third row (first land row 23*g*)>the land-to-land pitch in the fourth row (second land row 23*h*).

Then, in the third wiring layer, the lands for flip-chip connection in the fourth, fifth and sixth rows from the outermost periphery are drawn out and are connected to lands for solder ball connection in the fifth and sixth rows. The lands 23*d* for flip-chip connection in the fourth and fifth rows are arranged at a pitch which permits one wire to be disposed between adjacent lands.

Next, in the fourth wiring layer, the lands for flip-chip connection in the fifth and sixth rows from the outermost periphery are drawn out and are connected to lands for solder ball connection in the sixth row from the outermost periphery. The lands for flip-chip connection in the seventh and eighth rows are non-contact pins, which are not connected to lead-out wires 23*e*.

In this way, in each wiring layer, the lands 23*d* for flip-chip connection and the land 23*d* for solder ball connection are connected through lead-out wires 23*e* to complete distribution of wires in the fan-in/-out type semiconductor.

Sixth Embodiment

Figure 45:
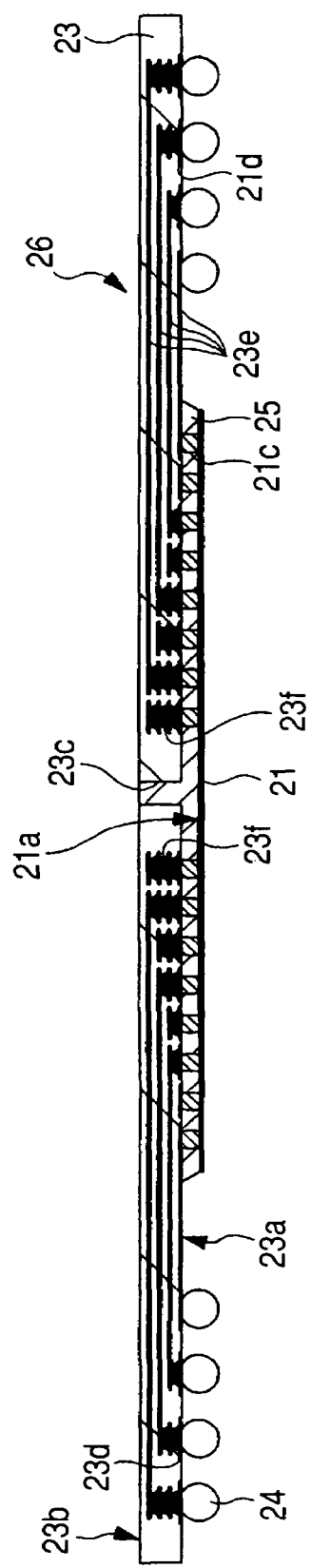
FIG. 45 is a sectional view showing a structural example of a semiconductor device according to a sixth embodiment of the present invention.
Figure 46:
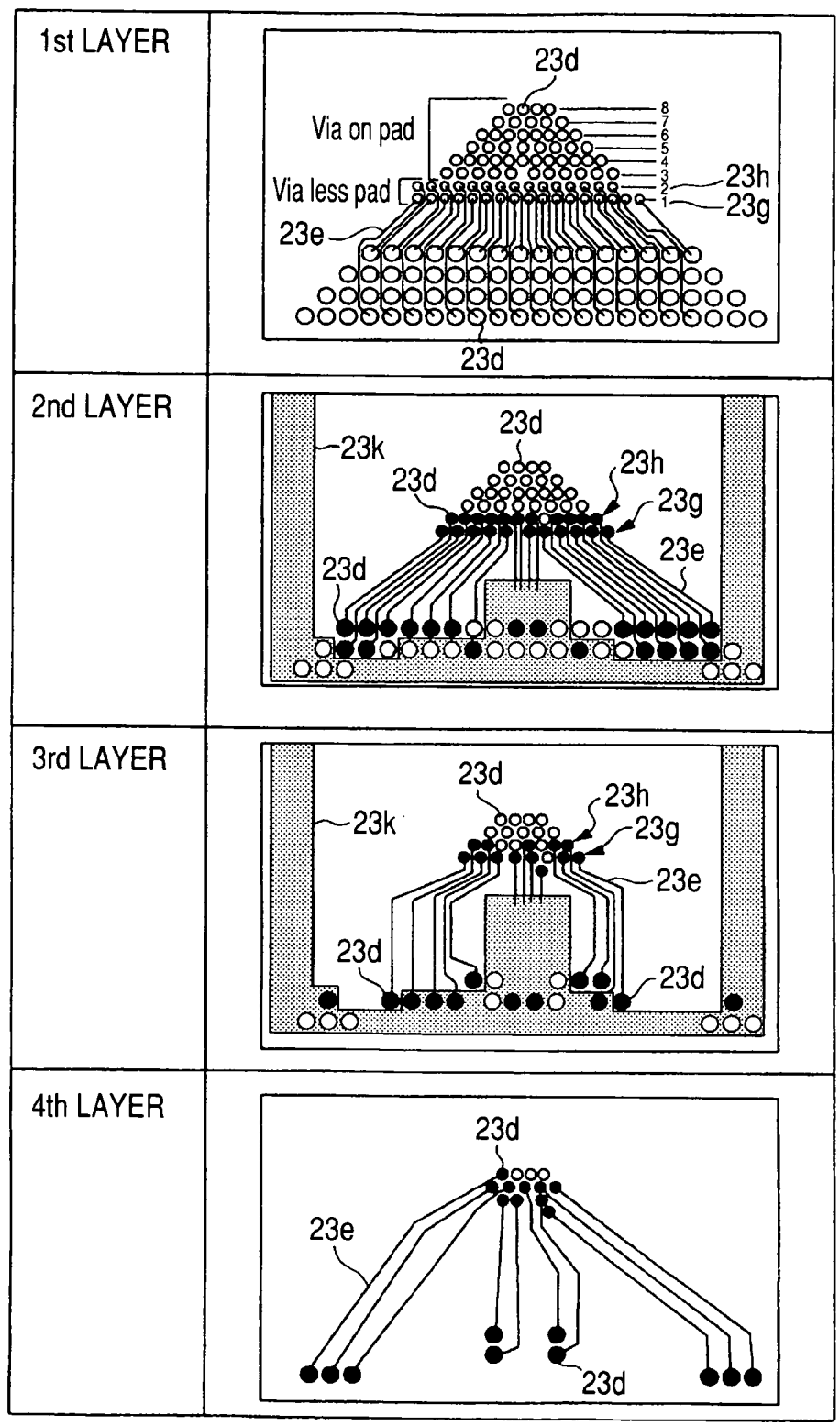
FIG. 46 is a diagram showing an example of a wire distribution rule in each wiring layer in a multi-layer wiring substrate incorporated in the semiconductor device illustrated in FIG. 45.
Figure 47:
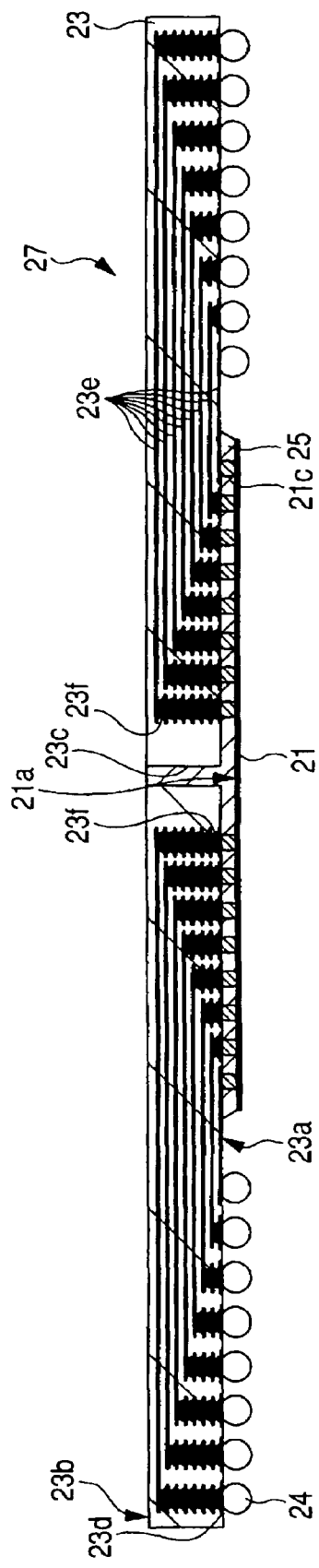
FIG. 47 is a sectional view showing the structure of a semiconductor device according to a modification of the sixth embodiment.

FIG. 46 is a diagram showing an example of a wire distribution rule in each wiring layer in a multi-layer wiring substrate incorporated in the semiconductor device illustrated in FIG. 45, and FIG. 47 is a sectional view showing the structure of a semiconductor device according to a modification of the sixth embodiment.

The semiconductor device of this sixth embodiment is a BGA 26 having a structure wherein plural solder balls 24 serving as external terminals are arranged outside and around a semiconductor chip 21 on the same side as a chip mounting side of a multi-layer wiring substrate 23.

In the BGA 26, as shown in FIG. 45, the semiconductor chip 21 and plural solder balls 24 are provided on one and the same surface of the multi-layer wiring substrate 23. In the BGA 26, the distribution of wires in each wiring layer is performed in the following manner in the case where power planes 23*k* provided as solid wirings for power supply are formed in inner layers in the multi-layer wiring substrate 23, as shown in FIG. 46.

In each wiring layer in the multi-layer wiring substrate 23 shown in FIG. 46, the distribution of wires is shown in only a one-fourth range of a substrate main surface, but, in the multi-layer wiring substrate 23 of the semiconductor device, the illustrated distribution of wires covers the whole range of the substrate main surface.

First, in the first wiring layer (surface layer 23*a*), of the latticewise arranged lands 23*d* for flip-chip connection, the lands 23*d* in the first land row 23*g* located at the outermost periphery position and the lands 23*d* in the second row (second land row 23*h*) from the outermost periphery are drawn out and are connected to predetermined lands 23*d* for solder ball connection located in the inner- and outermost peripheries.

In this case, since the lands 23*d* for flip-chip connection in the two outermost rows are lands connected directly to lead-out wires 23*e* without going through via holes 23*f*, the land diameter is set small and the land-to-land pitch is set to a minimum narrow pitch. However, one wire is disposed between adjacent lands in the first land row 23*g* located at the outermost position. The lands 23*d* for flip-chip connection in the third and subsequent rows from the outermost periphery are connected to the next layer through via holes 23f. In this case, the land diameter is larger than that in the two outermost rows because of the connection to the via holes 23f.

Subsequently, in the second wiring layer, the lands for flip-chip connection in the third row (first land row 23g) and fourth row (second land row 23h) from the outermost periphery are drawn out and are connected to lands for solder ball connection in the second and third rows from the outermost periphery. In this case, the lands for flip-chip connection in the third row (first land row 23g) are arranged at a pitch which permits one wire to be disposed between adjacent lands. The lands in the fourth row (second land row 23h) are arranged in only a minimum space because it is not necessary to pass a wire between adjacent lands. Thus, there exists a relation of the land-to-land pitch in the third row (first land row 23g)>the land-to-land pitch in the fourth row (second land row 23h).

In the second wiring layer, there is a power plane 23k. The spacing between adjacent lands for flip-chip connection is narrow, and it is impossible to ensure a clearance with respect to lands 23d not connected to the power plane 23k, for which reason the power plane 23k is disposed so as to surround the lands 23d for flip-chip connection.

As to the lands 23d for solder ball connection, it is possible to ensure a clearance with respect to lands 23d not connected to the power plane 23k, and, hence, it is possible to dispose the power plane 23k.

In the case where wiring is needed in the second layer, it is preferable to draw out wires together in the four corners of the BGA 26, whereby the power plane 23k need not be cut.

Subsequently, in the third wiring layer, the lands for flip-chip connection in the fifth and sixth rows from the outermost periphery are drawn out and connected to lands for solder ball connection in the second and third rows from the outermost periphery. In this case, the lands for flip-chip connection in the fifth row (first land row 23g) are arranged at a pitch which permits one wire to be disposed between adjacent lands. Further, the lands in the sixth row (second land row 23h) are arranged in only a minimum space, because it is not necessary to pass a wire between adjacent lands. Thus, there exists a relation of the land-to-land pitch in the fifth row (first land row 23g)>the land-to-land pitch in the sixth row (second land row 23h).

A power plane 23k is provided also in the third layer. Since the spacing between lands for flip-chip connection is narrow and it is impossible to ensure a clearance with respect to the lands 23d that are not connected to the power plane 23k, the power plane 23k is disposed so as to surround the lands 23d for flip-chip connection.

As to the land 23d for solder ball connection, as in the second layer, the power plane 23k can be disposed because it is possible to ensure a clearance with respect to the lands 23d that are not connected to the power plane 23k.

Next, in the fourth wiring layer, the lands for flip-chip connection in the sixth, seventh and eighth rows (including the fifth row partially) from the outermost periphery are drawn out and are connected to lands for solder ball connection in the first, second and third rows from the outermost periphery. Of the four pins in the eighth row for flip-chip connection, three pins are non-contact pins, which are not connected to lead-out wires 23e.

In this way, in each wiring layer, the lands 23d for flip-chip connection and the lands 23d for solder ball connection are drawn out and are connected through lead-out wires 23e to complete distribution of the wires in the BGA 26.

As is the case with the BGA 26 of this sixth embodiment, even when the semiconductor chip 1 and plural solder balls 24 are provided on one and the same side of the multi-layer wiring substrate 23 and power planes 23k which serve as solid wirings are provided in inner layers in the multi-layer wiring substrate 23, it is possible to distribute wires in each wiring layer, as seen in FIG. 46, and, therefore, even in the BGA of this sixth embodiment, it is possible to obtain the same effects as in the BGA 22 of the fifth embodiment.

FIG. 47 shows a BGA 27 according to a modification of the sixth embodiment. The BGA 27 has a structure, wherein at the time of drawing out lead-out wires 23e from lattice-wise arranged lands 23d for flip-chip connection, as in the BGA 26, the lands are drawn out one row, not two rows, at a time in each wiring layer.

More specifically, the BGA 27, provided as a semiconductor device having a multi-pin structure, uses a multi-layer wiring substrate 23 having wiring layers in accordance with rows of latticewise arranged lands 23d for flip-chip connection. In the structure shown in FIG. 47, the multi-layer wiring substrate 23 has eight wiring layers.

Even in this case, lands 23d for flip-chip connection in each wiring layer are drawn out one row at a time and connected to predetermined lands 23d for solder ball connection, whereby the same effects as in the BGA 26 can be obtained also in the BGA 27.

Although the present invention has been described concretely on the basis of various embodiments thereof, it goes without saying that the invention is not limited to the above-described embodiments, but that various changes may be made within a scope not departing from the gist of the invention.

In connection with each of the above first, second, third and fourth embodiments, a description has been given mainly concerning a semiconductor package comprising of a total of four layers of package structures, but the number of stacked package structures is not specially limited insofar as each package structure has a flip-chip connection structure and such package structures are stacked in two or more stages in a sealed state with an under-fill resin.

In connection with the above-described fifth and sixth embodiments, a description has been given of the case where lead-out wires 23e are drawn out one or two rows at a time in each wiring layer when they are to be drawn out from latticewise arranged lands 23d for flip-chip connection. However, the number of rows to be drawn out in each wiring layer is not specially limited, and various changes may be made depending on the number of pins, the land-to-land pitch, or the number of wiring layers in the multi-layer wiring substrate 23.

Effects obtained by typical modes of the invention as disclosed herein will be outlined below.

By making the number of wiring layers larger in the substrate with a logic/ASIC chip mounted thereon than in the substrate with a memory chip mounted thereon, it becomes easier to effect distribution of wires, and, consequently, it is possible for the semiconductor device to have wiring layers that are not used for distribution to external terminals. As a result, another semiconductor element, a passive component, or a socket can be mounted; and, for distribution of its wires, the wiring on the aforesaid wiring layer can be used, and, hence, it is possible to attain a high density packaging of the semiconductor device.

What is claimed is:

1. A semiconductor device comprising:
a first wiring substrate having a first main surface and a second main surface opposing the first main surface;
a first semiconductor chip having a logic circuit, and mounted on the second main surface of the first wiring substrate, and electrically connected to the first wiring substrate;
a second wiring substrate having a first main surface and a second main surface opposing the first main surface, the second wiring substrate being stacked over the first main surface of the first wiring substrate, and electrically connected to the first wiring substrate through a plurality of salient electrodes;
a second semiconductor chip having a memory circuit, and mounted on the second main surface of the second wiring substrate, and electrically connected to the second wiring substrate; and
a plurality of external terminals formed over the second main surface of the first wiring substrate,
wherein the number of wiring layers in the first wiring substrate is larger than that in the second wiring substrate;
wherein the plurality of salient electrodes is arranged around the second semiconductor chip; and
wherein the plurality of external terminals is arranged around the first semiconductor chip.

2. A semiconductor device according to claim 1, wherein another second wiring substrate mounting another second semiconductor chip having a memory circuit is stacked over the second wiring substrate through the salient electrodes.

3. A semiconductor device according to claim 2, wherein the memory circuit of the other second semiconductor chip is different from the memory circuit of the second semiconductor chip.

4. A semiconductor device according to claim 1, wherein wires for connecting the plurality of salient electrodes formed over the second wiring substrate and the plurality of external terminals provided over the first wiring substrate are formed in the first wiring substrate.

5. A semiconductor device according to claim 1, wherein the first semiconductor chip and the second semiconductor chip are flip-chip-connected to the respective substrates.

6. A semiconductor device according to claim 1, wherein the second wiring substrate is a filmy tape substrate.

7. A semiconductor device according to claim 1, wherein a through hole is formed at a portion of the first wiring substrate corresponding to the nearly central of the first semiconductor chip.

8. A semiconductor device according to claim 1, wherein a thickness of the first wiring substrate is thicker than that of each second wiring substrate.

9. A semiconductor device according to claim 1, wherein the size of the first semiconductor chip is smaller than that of second semiconductor chip.

10. A semiconductor device according to claim 1, wherein:
both the first semiconductor chip and the second semiconductor chip have a plurality of pins respectively, and
the number of pins of the first semiconductor chip is larger than that of the second semiconductor chip.

11. A semiconductor device according to claim 1, wherein an other second wiring substrate mounting an other second semiconductor chip having a memory circuit is stacked over the second wiring substrate through the salient electrodes.

12. A semiconductor device according to claim 1, wherein a height of each of the plurality of salient electrodes is higher than that of the second semiconductor chip.

13. A semiconductor device according to claim 1, wherein a height of each of the plurality of external electrodes is higher than that of the first semiconductor chip.

* * * * *